(12) United States Patent
Guglielmo et al.

(10) Patent No.: US 11,029,671 B1
(45) Date of Patent: Jun. 8, 2021

(54) INTEGRATED WIRE HARNESS BATCH PRODUCTION USING AUGMENTED REALITY

(71) Applicant: Automated Wiring Systems, LLC, San Antonio, TX (US)

(72) Inventors: Kennon Guglielmo, San Antonio, TX (US); Eric Peterson, San Antonio, TX (US)

(73) Assignee: Automated Wiring Systems, LLC, San Antonio, TX (US)

(*) Notice: Subject to any disclaimer, the term of this patent is extended or adjusted under 35 U.S.C. 154(b) by 0 days.

(21) Appl. No.: 16/547,785

(22) Filed: Aug. 22, 2019

Related U.S. Application Data

(60) Provisional application No. 62/721,361, filed on Aug. 22, 2018.

(51) Int. Cl.
| | |
|---|---|
| *G05B 19/418* | (2006.01) |
| *H01B 13/012* | (2006.01) |
| *H01R 43/20* | (2006.01) |
| *G06F 3/14* | (2006.01) |
| *G01R 31/69* | (2020.01) |

(52) U.S. Cl.
CPC ....... *G05B 19/41875* (2013.01); *G01R 31/69* (2020.01); *G06F 3/14* (2013.01); *H01B 13/01209* (2013.01); *H01B 13/01227* (2013.01); *H01R 43/20* (2013.01)

(58) Field of Classification Search
None
See application file for complete search history.

(56) References Cited

U.S. PATENT DOCUMENTS

| | | | |
|---|---|---|---|
| 9,257,808 B1* | 2/2016 | Guglielmo | H01B 13/01245 |
| 2016/0335800 A1* | 11/2016 | DeStories | G02B 27/0172 |
| 2018/0041072 A1* | 2/2018 | Clifton | H02J 15/00 |
| 2018/0203053 A1* | 7/2018 | Lussier | G01R 31/58 |
| 2020/0052517 A1* | 2/2020 | Rosso | H02J 7/345 |

\* cited by examiner

*Primary Examiner* — Jeffrey J Chow
(74) *Attorney, Agent, or Firm* — William H. Quirk; Jesse L. Frizzell; Rosenthal Pauerstein Sandoloski Agather, LLP

(57) ABSTRACT

Virtually-integrated wire harness design and automated production systems and methods that achieve completely integrated data management by automatically producing scripts to dynamically propagate production commands and data to various subsystems for handling assembling necessary circuits and wire harness layout boards to produce corresponding batches of wire harnesses while script-based methods control configuring, testing, and using wire harness layout boards, and assembling, testing, reworking, and delivering wire harnesses. Augmented reality is used to assist in the assembly of layout boards and wire harnesses.

14 Claims, 24 Drawing Sheets

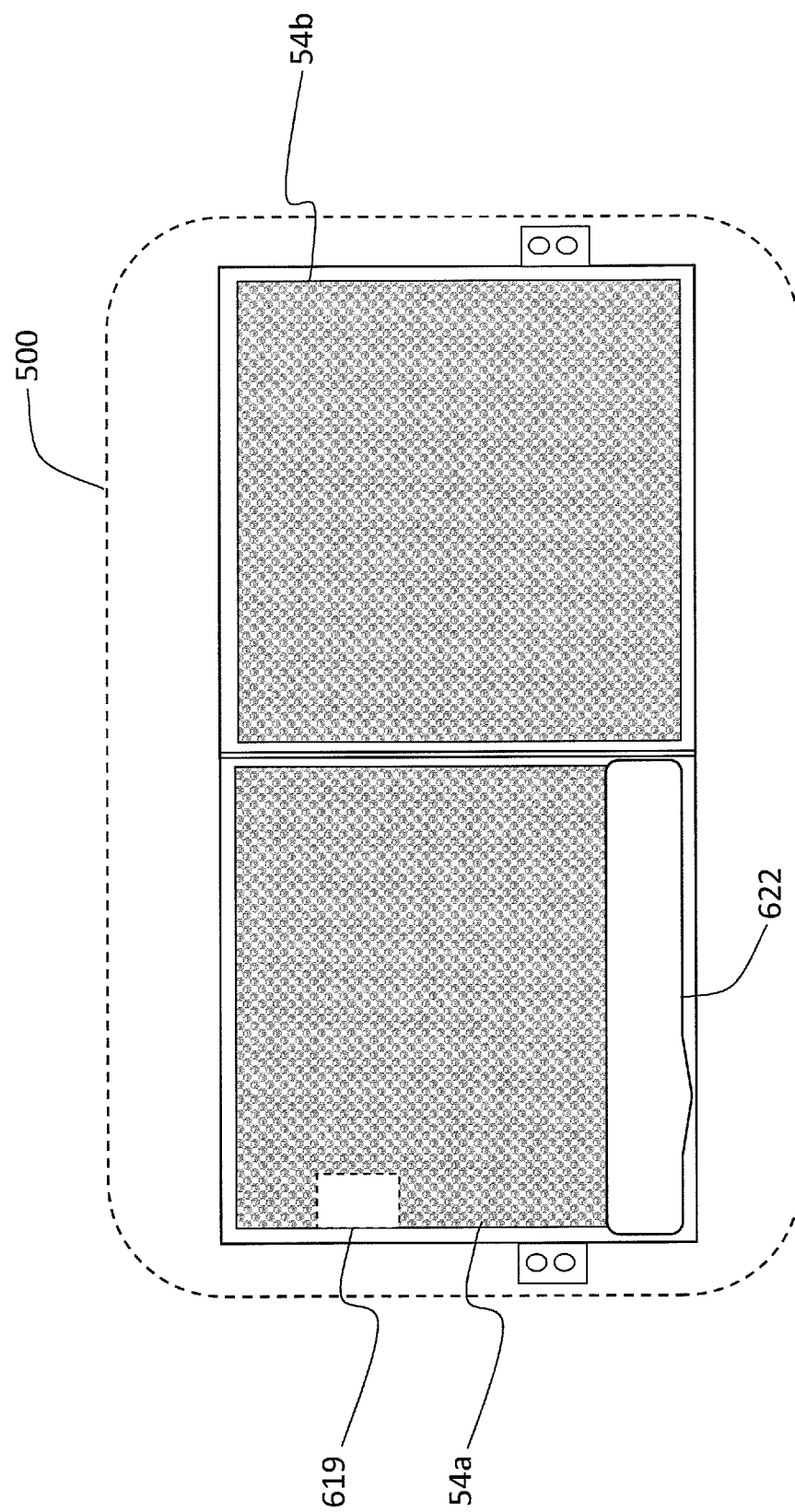

INTEGRATED WIRE HARNESS BATCH PRODUCTION USING AUGMENTED REALITY

CLAIM OF PRIORITY TO PRIOR APPLICATION

This application claims the benefit of prior filed U.S. Provisional Application Ser. No. 62/721,361, filed Aug. 22, 2018. The entire disclosure, including the claims and drawings, of U.S. Provisional Application Ser. No. 62/721,361 is hereby incorporated by reference into the present disclosure as if set forth in its entirety.

FIELD OF THE INVENTION

The present invention relates to manufacturing of wire harnesses using augmented reality. More particularly, the present invention relates to systems and methods for complete data management integration in readily-changeable computer-controlled batch production of wire harnesses, from design and raw wires and terminals to final assembly and quality control.

BACKGROUND

Wire harness assembly has long been a labor intensive exercise which has not fully benefited from integrated data management methods due to long-standing mindsets and formidable obstacles. Wire harness assembly personnel have selected, measured, cut, crimped, bent, labeled, and finally placed, connected, and tied tens, and sometimes hundreds, of individual wires of varying lengths, gauges, and types to form a completed wire harness. If even a single wire in the harness is flawed, the harness may have to be repaired or discarded. Over the years, numerous inventions have attempted to automate some or all of wire harness assembly, with varying degrees of success. Some inventions have focused on separately preparing wire circuits (i.e., the individual wire segments with terminals) apart from the wire harness assembly process. In automated wire circuit preparation inventions, machines are used to select, measure, and crimp roll wire into wire circuits, and then other means are used to transport the circuits to an assembly station. The individual wire circuits are sometimes stored on reelettes or held by clamps, but these methods have inefficiencies and complexities that have long needed improvement. Their complex structures, difficulty in adapting to varying wire circuit specifications, expense of acquisition, use, and maintenance have long needed to be improved. For example, winding wire circuits onto reelettes may introduce anomalous spring tension and irregular bends. Thus, retrieval systems must either have additional complexity to adapt to the varying wire circuit lengths based on unintended bends and spring tension, or risk failures to retrieve some wire circuits. Winding wire circuits onto reelettes may also result in plastic deformation of metal wire. This work hardening may cause immediate wire failure, or may leave a latent defect. The circuit may pass its initial continuity test, but later fail well before its design life due to the residual stress. Further, the winding, storage, and retrieval systems must consistently secure each wire circuit's ends when the circuit lengths can vary due to anomalies introduced by the winding process itself.

Other inventions do not wind the wire circuits; rather, they use clamps to hold each outstretched circuit. This requires much more storage space than a reelette because of the need to accommodate the full length of outstretched wires, isolate each circuit, and provide separation distance between circuits' clamps. The relatively low storage density for the wire circuits can force increased workspace areas, with corresponding increases in overhead costs. Positioning equipment must precisely place the wire circuit for proper clamping, and the clamps must hold the wire circuit securely. In case of system misalignment or error, the clamps may damage circuit ends when the circuit is clamped or retrieved. Because the number of clamps is directly proportional to the number of circuits to store or transport, the quantity of clamps brings a corresponding number of mechanical failures. To prevent costly failures, operators must incur the costs of monitoring, repairing, and replacing the clamps. Further, clamps may fail to successfully grip one or more of the circuit's ends. In such cases, operating machinery may become fouled by untethered wire circuits.

When wire circuits are prepared apart from the wire harness assembly area, the wire circuits must be moved to the assembly station. The wire circuits can be transported singly or in batches, but each circuit must be uniquely identified so that it can be properly processed. Existing systems suffer from unnecessary complexities and limitations in maintaining or transferring the data, as well as in effectively presenting the wire circuits in assembly order to a human or machine.

The systems and methods of the present invention overcome many of the problems and limitations of the prior art. Furthermore, the addition of augmented reality displays increases the accuracy, speed, and efficiency of previous inventions.

BRIEF SUMMARY OF THE INVENTION

The present invention includes systems and methods which provide completely integrated data management. The methods include producing machine-readable, standardized scripts that are dynamically propagated throughout the entire production system. The present invention also automates many of the steps in configuring, labeling, testing, and using wire harness layout boards, and in assembling, testing, reworking, and finishing wire harness assemblies. Aspects of the present invention use pneumatic means to load individual wire circuits into a storage and transport system, such as a batch cart, for later assembly into one or more wire harnesses. The batch cart has an array of individual tubes that are pneumatically loaded with individual wire circuits, one or more circuits to a tube. The cart contains a memory device that stores identifying information for each wire circuit including its position in the tube array. The tubes may vary in diameter or length, but each tube is of sufficient length to accommodate the wire circuit, or circuits, with which it is loaded. The batch cart supports wire circuits of varying types, lengths, and end connectors without the limitations and complexities required for coiling the circuits or for individually clamping each circuit's ends. The batch cart provides a high storage density for the wire circuits and minimizes the materials and space needed to store and transport the circuits. Further, a series of batch carts can receive wire circuits from an entire production shift and conveniently store the circuits for subsequent assembly.

When the wire harnesses are to be assembled, the batch cart is transported to the assembly area. A pneumatic means automatically retrieves each circuit from the indexed tube array and presents it to a human or robotic assembler in the order it is to be installed into the wire harness assembly. The assembly area includes a double buffer assembly that greatly reduces the wait time for the assembly personnel for each circuit element.

A preferred embodiment uses augmented reality glasses to superimpose information over real-life programmable modules into the field of view of the user. Augmented reality glasses may be used to provide visual cues for installation of tool posts (smart jigs) and turning posts in smart boards (programmable modules). In an alternative embodiment, augmented reality glasses can display information and visual cues in a specific location, such as the top right corner of one lens. In this alternative, the user is able to look at the real-life assembly and look to the corner of the lens for guidance. This embodiment differs because the information is displayed on the glasses but is not "superimposed" directly over the real-life assembly. Further, the augmented reality glasses are capable of displaying images that provide visual direction to the personnel carrying out the wire harness assembly to direct them to place a given circuit element in a given position and to connect it to the specific bundles and/or connector in place on the physical harness assembly table.

BRIEF DESCRIPTION OF THE DRAWINGS

FIG. 2B is a view of an augmented reality display with superimposed prompts for instructing the user to install tool posts (smart jigs) and the corresponding wire harness connectors.

DETAILED DESCRIPTION OF THE PREFERRED EMBODIMENTS

As indicated above, it is an objective of the present invention to provide for an extremely flexible manufacturing and tooling system for the design and production of wire harnesses. The system is designed to allow the same set of tooling structures to be utilized in conjunction with a wide variety of wire harness designs and configurations, and at the same time to maintain a high level of quality control and a highly efficient manufacturing process. The systems and methods described allow for the rapid re-tooling of the system to accommodate small or large manufacturing runs and rapid change-over to the production of a new wire harness design. The systems and methods further facilitate the immediate testing and verification of the manufactured wire harnesses as well as the tracking and training of personnel involved in the production process. The following drawing figures provide an overview of the hardware and software systems utilized to carry out the methods of the present invention.

The construction of a harness generally comprises the collection, bundling, and association of a large number of circuit elements (wires with terminal ends) that are collected and assembled into various types of standard and custom connectors that are positioned on the wire harness table according to a pre-determined layout and configuration. Various components positioned on the wire harness table facilitate the placement, positioning, bundling, and insertion of the circuit elements into the various connectors. As indicated above, existing wire harness assembly systems typically rely upon the complete manual construction of a wire harness on an assembly table after which the completed harness is removed from the table and tested in a separate location, wire by wire, or connector by connector. The present invention improves the efficiency of the manufacturing process by carrying out testing and verification of the wire harness immediately upon placement and connection of each circuit element within the wire harness structure.

The system of the present invention further provides prompts, directions, and other instructions to the assembly personnel constructing the wire harness by way of a number of visual and aural prompts and confirmations. The aural and visual prompts in the present invention are provided using a number of different elements in the augmented reality display 500 of a wire harness assembly sub-system.

Figure 1:
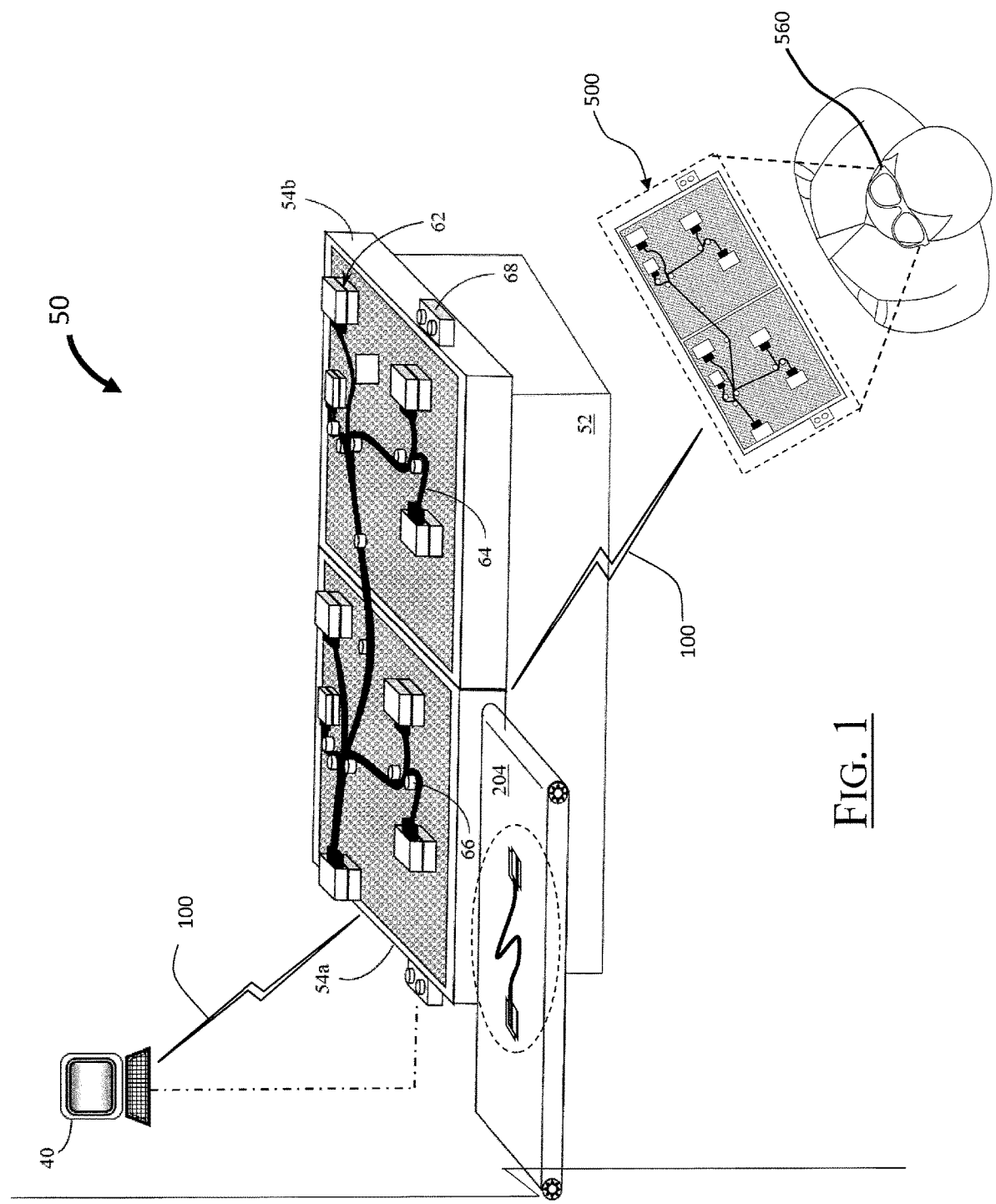
FIG. 1 is a view of a wire harness assembly table and a view of a user looking through an augmented reality display of a particular wire harness assembly in process.

As shown in FIG. 1, one of the embodiments of the present invention includes an augmented reality display 500 (bottom right corner) of a wire harness assembly sub-system. Shown above the augmented reality display 500 is the physical wire harness assembly 50. The display 500 is viewed by a user through augmented reality glasses 560, preferably using Microsoft HoloLens augmented reality software. In this embodiment, a user wears augmented reality glasses 560 which superimpose information over real-life programmable modules ("smart boards") 54*a*, 54*b* into the field of view of the user. The terms "smart board" and "programmable module" are used herein interchangeably. The smart boards 54*a*, 54*b* may wirelessly transmit information via wireless connection 100 that is then displayed on augmented reality glasses 560. Such information includes directions and visual cues for assembly of the wire harness. The augmented reality glasses 560 are capable of displaying images that provide visual direction to the personnel carrying out the wire harness assembly to direct the personnel to place a given circuit element in a given position and to connect it to the specific bundles and/or connectors in place on programmable modules 54*a*, 54*b* on the physical harness assembly table 52. The display 500 of both the real-life view and other information superimposed is defined here as the Augmented Reality User Interface ("ARUI").

In an alternative embodiment, augmented reality glasses 560 can display information and visual cues in a specific location, such as the top right corner of one lens. In this alternative, the user is able to look at the real-life assembly and look to the corner of the lens for guidance. This embodiment differs because the information is displayed on the glasses but is not "superimposed" directly over the real-life assembly.

Figure 13B:
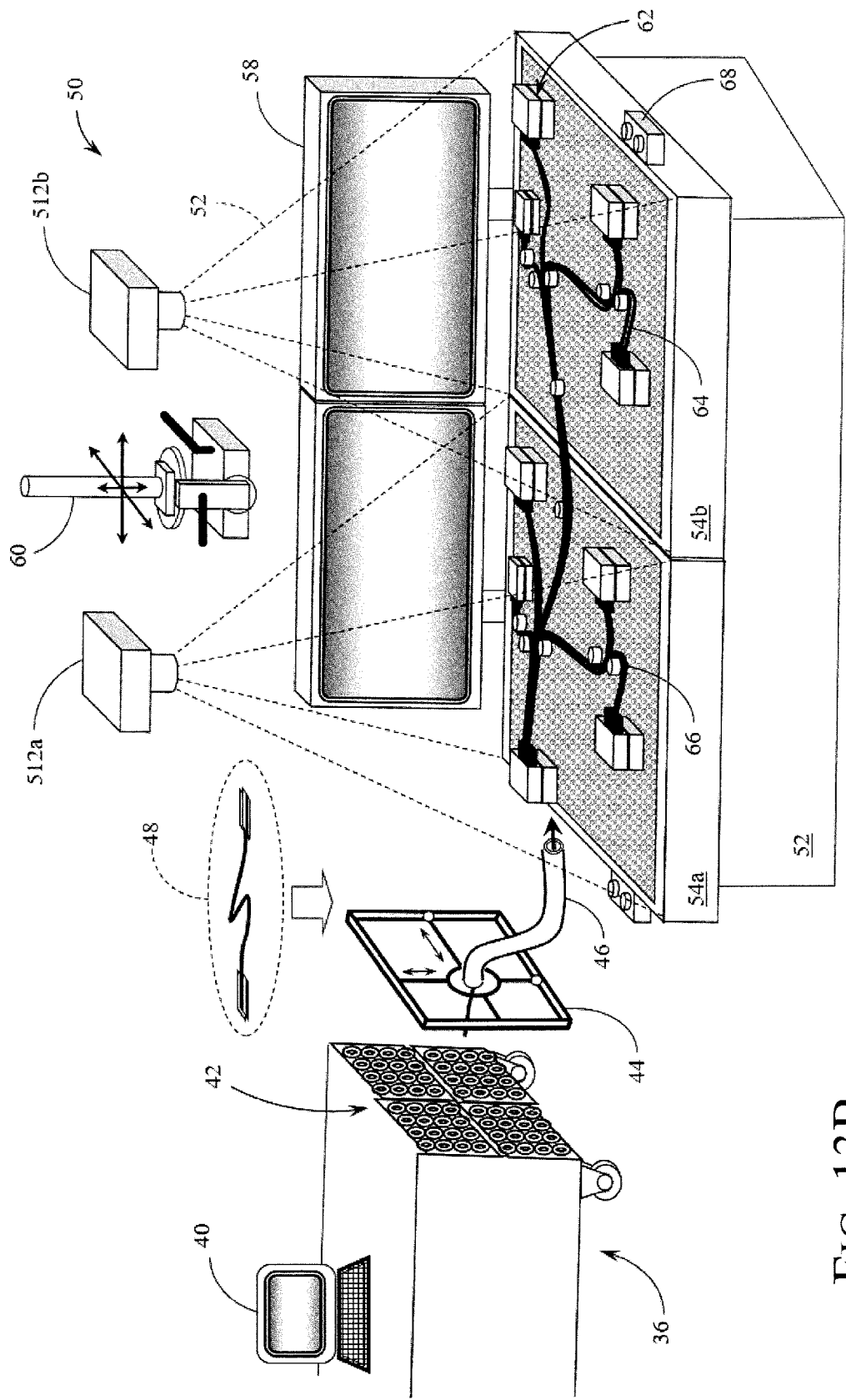
FIG. 13B is a partial schematic perspective view of an alternative embodiment of the wire harness assembly sub-system (assembly table) of the present invention.
Figure 14:
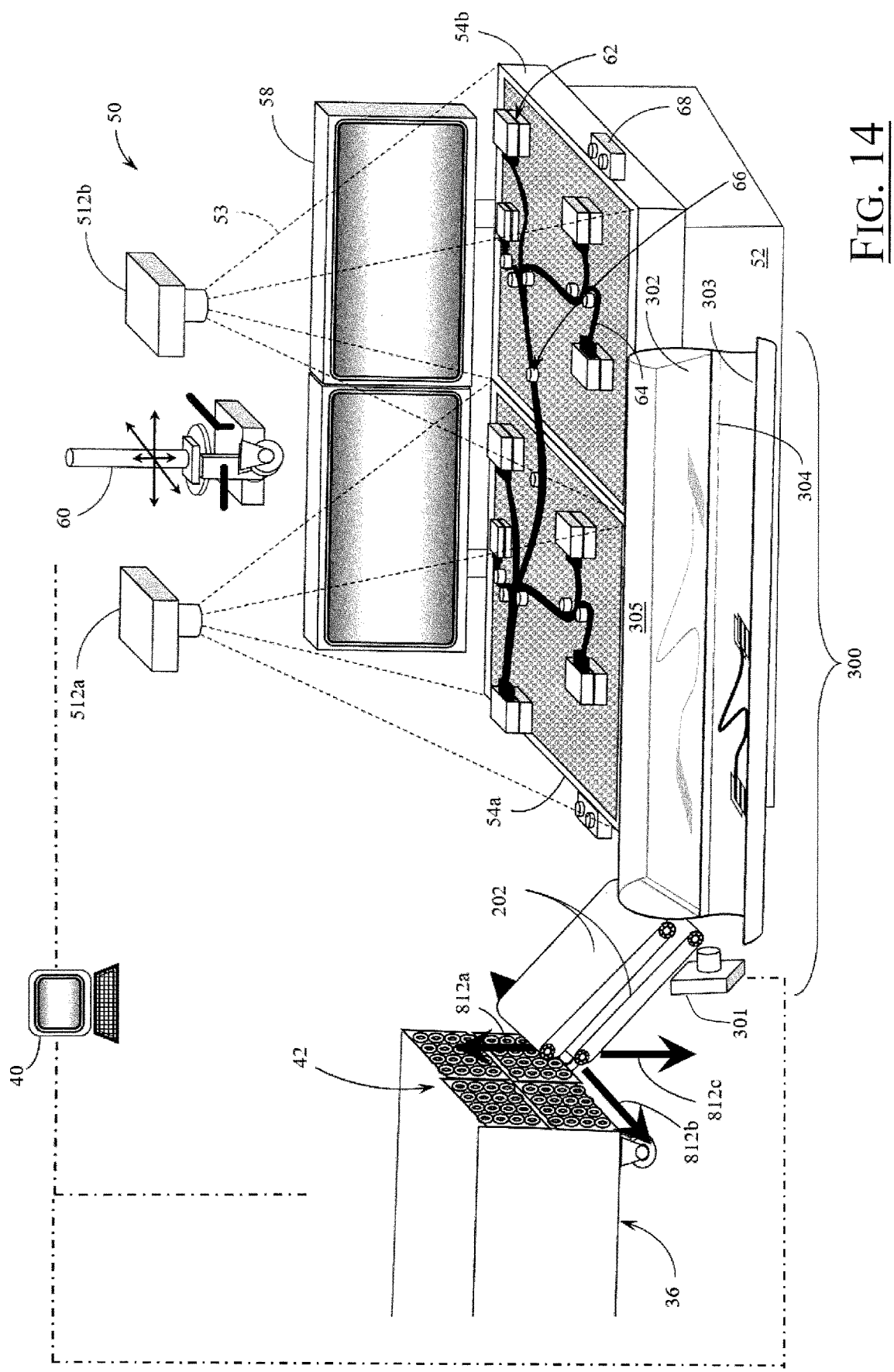
FIG. 14 is a partial schematic perspective view of an improvement to the wire harness assembly sub-system (assembly table) as depicted in 8B.

Customization of the wire harness according to specific needs related to specific connectors and terminal ends, such as the placement of ultrasonic soldering to non-typical connector assemblies, typically will take place off of the assembly table 52. Other embodiments may employ mechanisms placed on tooling configuration system 60 (as shown in FIGS. 7B, 13B, and 14) so as to be made accessible to any portion of the assembly table programmable modules 54*a* & 54*b*. Tooling configuration system 60 is preferably positioned in an overhead track-mounted gantry as illustrated. The process of assembling a wire harness 64 in production through to completion is partially automated according to the prompting and instruction systems described above, but is ultimately within the manual control of the assembly personnel who initiate and terminate the automated system by activating assembly table start/stop control 68.

Figure 2A:
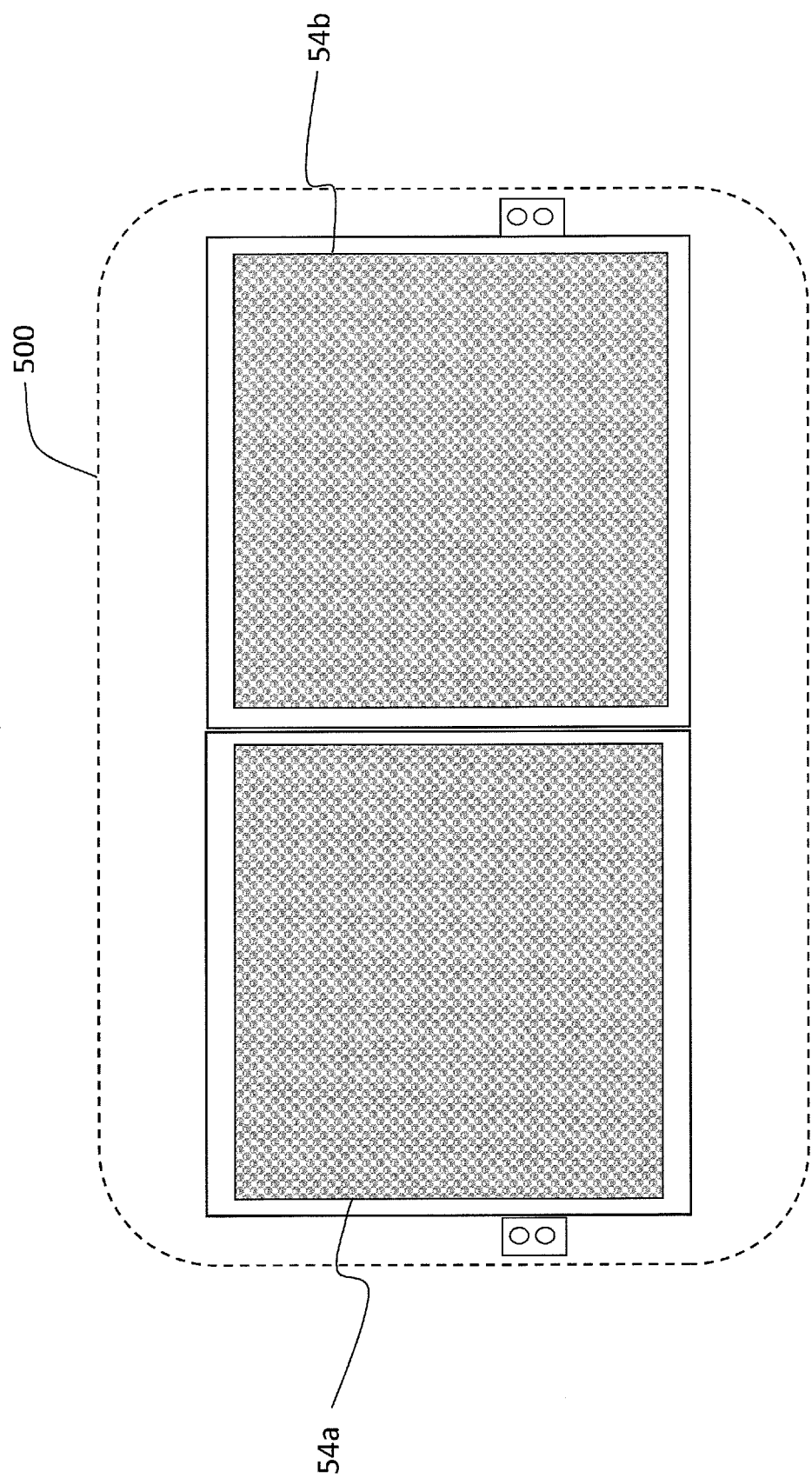
FIG. 2A is a view of two programmable modules or smart boards isolated from the rest of wire harness assembly as seen through augmented reality glasses on an augmented reality display.

Turning to FIG. 2A, there is shown a view of programmable module 54*a* and programmable module 54*b* as would be seen on the augmented reality display 500. The display 500 illustrates that the programmable modules 54*a* and 54*b* are blank while the wire harness assembly 50 is turned off or prior to the beginning of the process of creating a wire harness assembly. In this view on the augmented reality display 500, the programmable modules 54*a* and 54*b* are shown in their entirety. When wire harness assembly begins, the augmented reality display 500 may superimpose instructive features onto the view of programmable modules 54*a*, 54*b*. In other embodiments, augmented reality display 500 zooms in to a smaller area of the programmable modules 54*a* and 54*b*, particularly in the area where placement of the wire harness assembly components is to take place, the zoomed view preferably changing to different physical locations on programmable modules 54*a*, 54*b* based on the placement requirements of additional wire harness assembly components.

Turning to FIG. 2B, there is shown augmented reality display 500 with prompts for instructing the user to install tool posts (smart jigs) 62 and the corresponding wire harness connectors. The dashed rectangle 619 represents the location on the assembly table for placing a tool post 62 (shown in FIG. 2C). Each different type of wire harness connector (into which a bundle of completed circuit elements may be positioned) will have a specific tool post 62 that interfaces between the connector and the assembly table programmable module 54*a*. On the bottom of augmented reality display 500, there is shown a text box 622 that is adapted to provide written instructions and feedback for correct placement and orientation of tool post 62. FIG. 2B shows the proper location 619 of first tool post 62 and subsequent tool posts will be placed in a similar manner. Once a tool post 62 is correctly placed, the user then follows instruction for placement of additional tool posts 62. Similarly, augmented reality display 500 will show the appropriate locations for placement of additional tool posts.

Figure 2C:
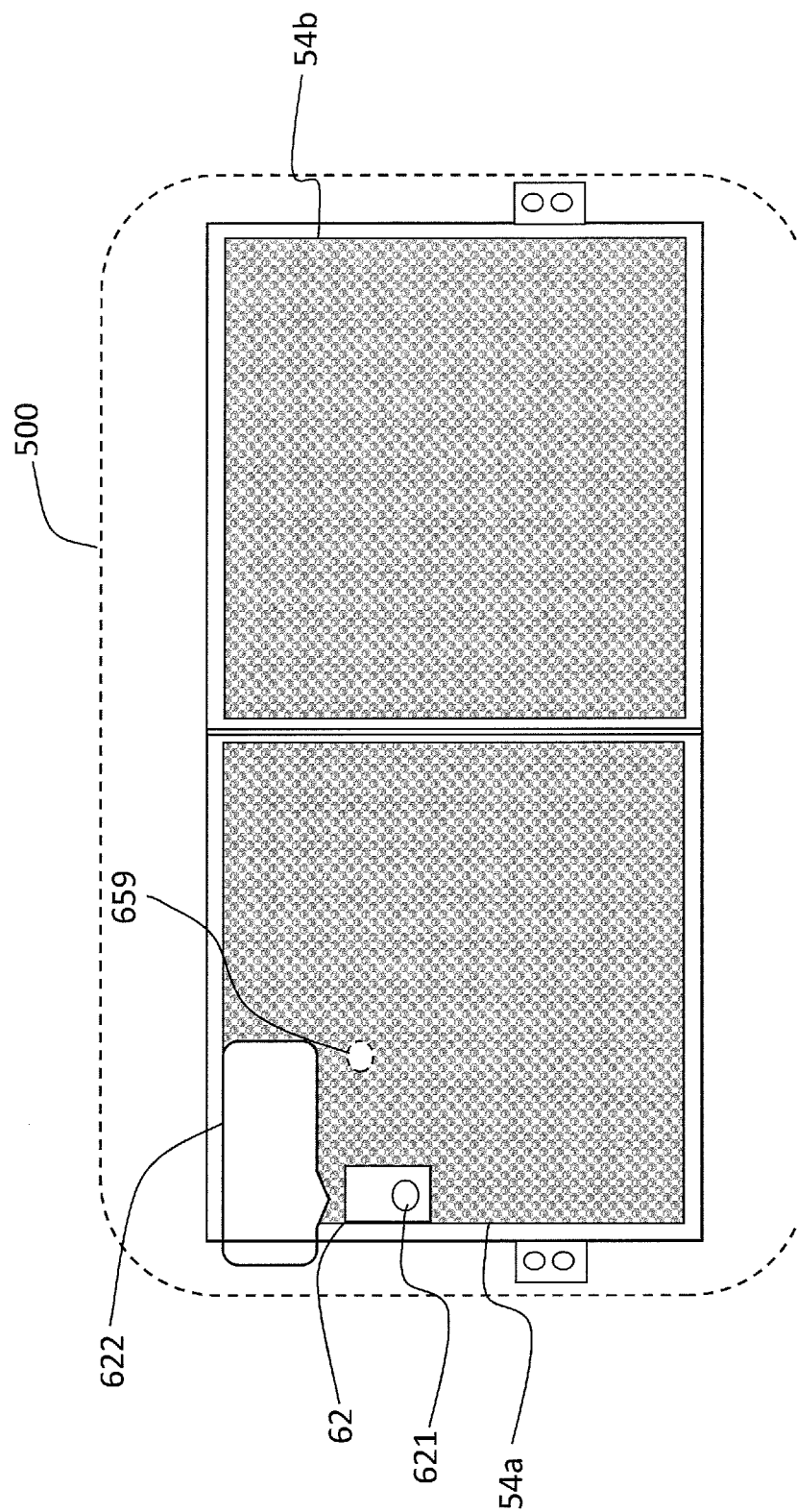
FIG. 2C is a view of an augmented reality display with superimposed prompts for instructing the user to install turning posts and tool posts.

Turning to FIG. 2C, there is shown augmented reality display 500 with prompts for instructing the user to install turning posts 66. The dashed circle 659 represents the location on the assembly table for placing turning post 66. In addition to tool posts 62 variably positioned on assembly table programmable modules 54*a* & 54*b* (as shown in FIG. 1), harness assembly turning posts 66 may likewise be positioned to facilitate the placement and positioning of the circuit elements (wires with terminal ends). On the bottom of augmented reality display 500, there is shown a text box 622 with instructions and feedback for correct placement and orientation of tool post 62. FIG. 2C shows the proper location 659 of one turning post 66 and subsequent turning posts will be placed in a similar manner.

The use of augmented reality glasses 560 allows a user to continue looking down at the physical wire harness assembly 52 while receiving visual prompts displayed on the glasses 560. The augmented reality display 500 is an improvement because users do not have to continuously look up at a separate display while assembling. This augmented reality process is more thoroughly explained in the following paragraphs describing the wire harness assembly.

Figure 3A:
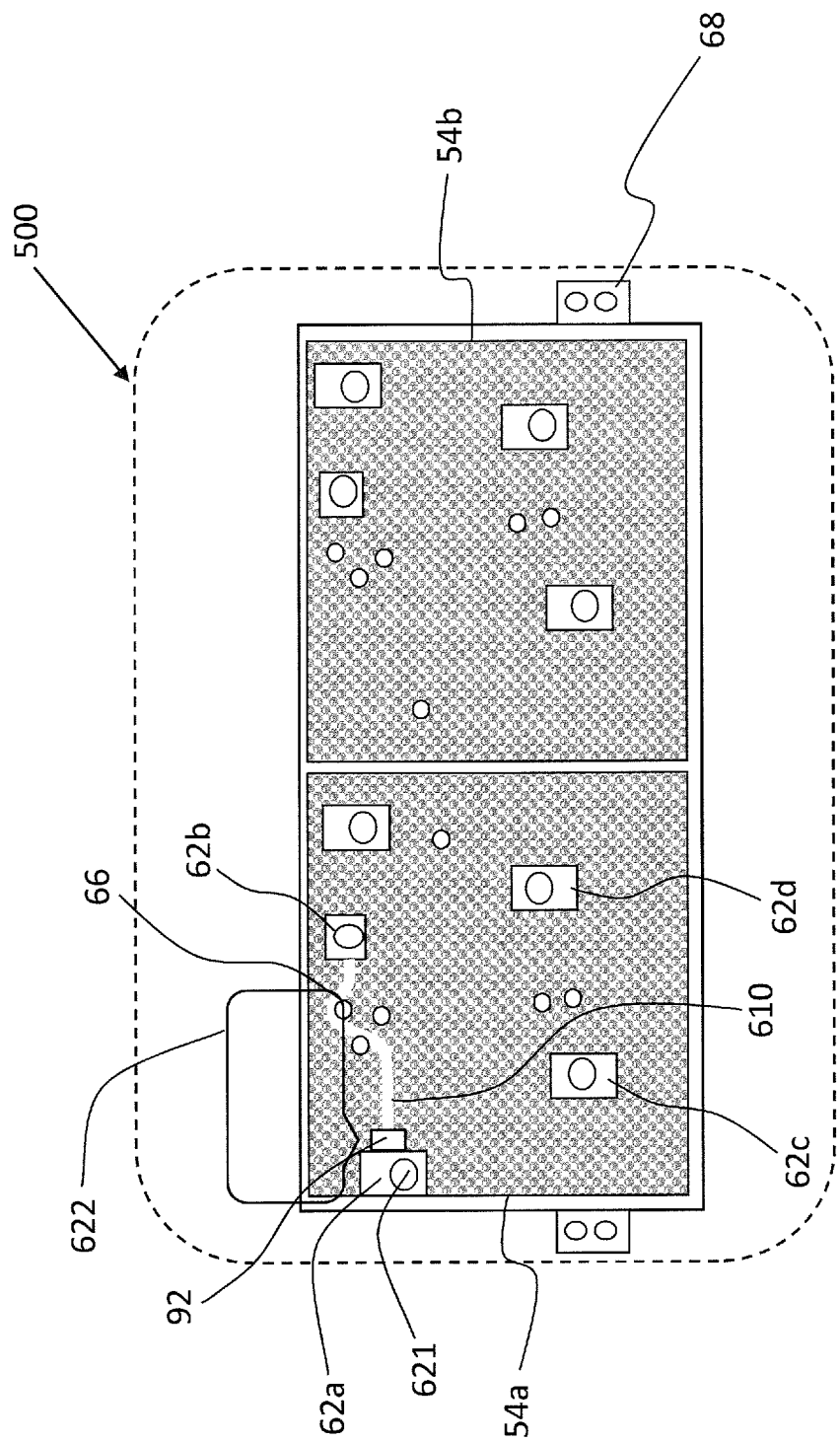
FIG. 3A is a view of augmented reality display as seen through augmented reality glasses.

Turning to FIG. 3A, there is shown augmented reality display 500 as seen through augmented reality glasses 560. The user views display 500 while looking down at wire harness assembly table 52. It is important to note that virtual prompts displayed in display 500 are limited to the immediate area around the particular tool post being utilized at a given time. In this case, for active tool post 62*a*, the text box 622, wire harness path 610, and lighting directing the placement of harness connector 92 are all virtually displayed to the user being superimposed on the actual view of the physical programmable modules 54*a*, 54*b*. The additional components visible in augmented reality display 500 are the real-life components, such as programmable modules 54*a*, 54*b* and all the tool posts 62. The text box 622 gives instructions to the user to retrieve a particular wire harness connector 92 from a bin array (not shown) and to place the connector into tool post 62*a*. Text box 622 preferably appears directly above the placement location. Various tool posts 62 are positioned on the assembly table programmable modules 54a & 54b and provide lighted indicators associated with the various connector ports directing the assembly personnel to insert a circuit element terminal end into a particular port on a particular harness connector 92. The system selectively illuminates individual wire ports in the tool posts 62 when the next step in the physical assembly 50 requires connection at the illuminated port. Such port illumination serves to ease the assembly process by designating the next succeeding step in the assembly, as appropriate. Turning posts 66 are also illuminated with at least four bright LEDs to assist in illuminating path 610. If the wire makes a right angle at turning post 66, only three LEDs would illuminate corresponding to the two directions along which the wire should be routed. In this manner, for example, the automated system of the present invention may provide a multi-faceted visual prompt to direct the placement of a particular circuit element along a physical path 610 associated with the physical assembly 50. Once the circuit has been positioned along the appropriate wire harness path 610, the individual attachment of the terminal ends of the circuit to the appropriate connectors may be directed by way of illuminated tool posts 62 which hold the individual connector structures. The user may then insert the appropriate terminal ends of the circuit element 64 (shown placed in position in FIG. 4) into the appropriate connector port as prompted by the illumination.

Figure 3B:
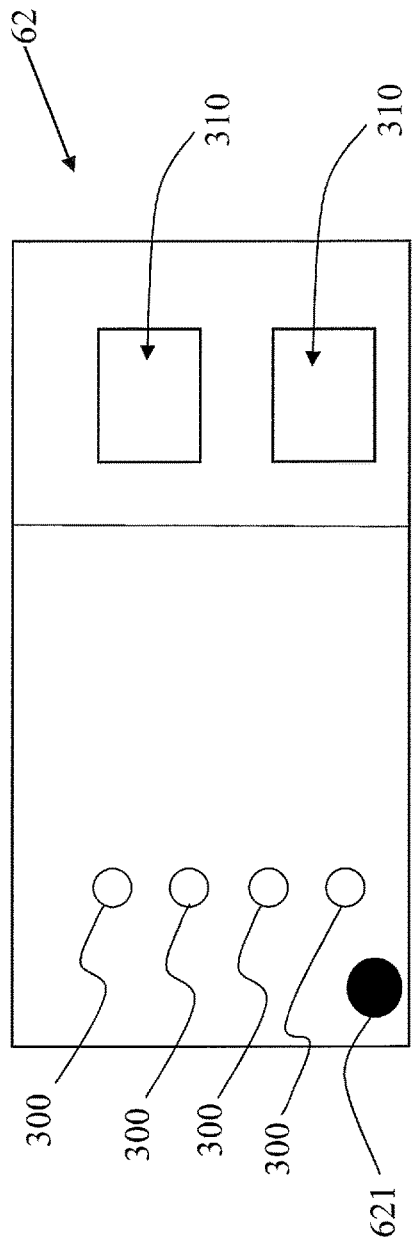
FIG. 3B is a view of the illuminated portion of a tool post for providing guidance to a user for placing a wire harness connector.

With reference to FIG. 3B, there is shown the illuminated portion of tool post 62 for providing guidance to a user for placing wire harness connector 92 (not shown). Tool post 62 is depicted and described in greater detail in FIG. 6 and ensuing paragraphs. Each tool post 62 has a translucent panel on its side that glows, and has at least four translucent dots 300 on top that glow brightly. The translucent dots 300 indicate to the user to "place the harness connector here." A pushbutton switch 621 allows the user to respond affirmatively to prompts and can "lock" harness connections in place.

Figure 3C:
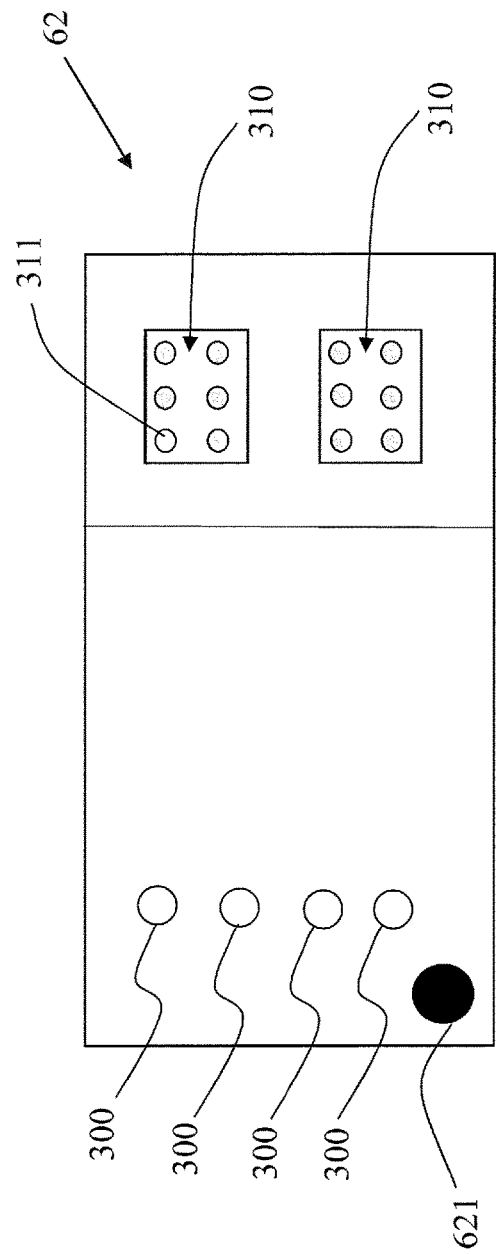
FIG. 3C is a view of the illumination of the location where the first end of a wire should be placed.

With reference to FIG. 3C, there is shown the illumination of the location 311 where the first end of a wire should be placed. The translucent dots 300 and location 311 are both illuminated. Within the cavity 310 of the connector, the hollow cavity probe (not shown) transmits light from a very high intensity LED. The light shines all the way through the cavity 310 of the connector and serves to illuminate location 311 which will receive a circuit element 64 (as shown in FIG. 4).

Figure 4:
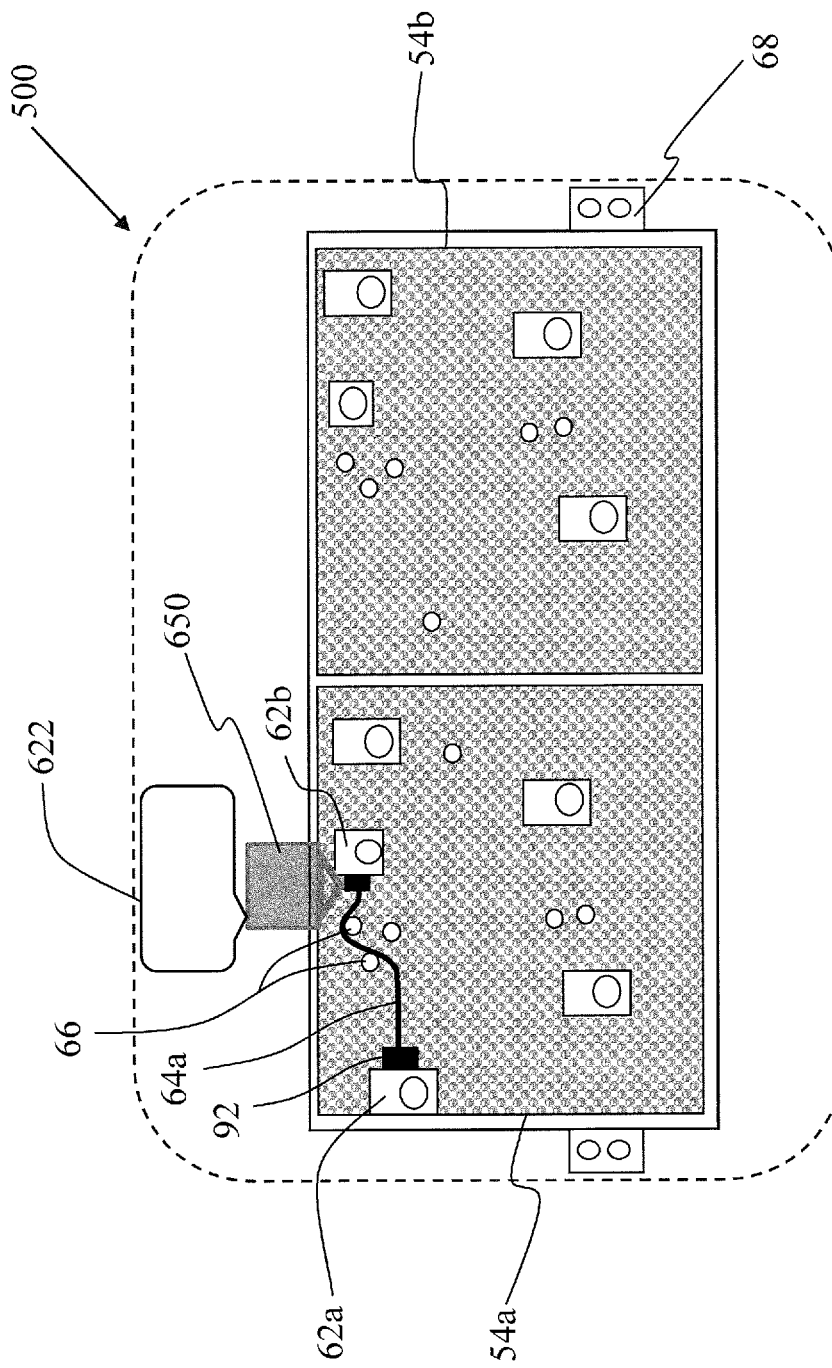
FIG. 4 is a view of the augmented reality display with a superimposed indication of successful verification and testing of a circuit element.

Turning to FIG. 4, there is shown the augmented reality display 500 resulting from successful verification and testing of a circuit element 64a. Circuit element 64a is connected to harness connector 92 and tool post 62a and wraps around turning posts 66. Another end of circuit element 64a is connected to tool post 62b. Once these connections are made for circuit element 64a, the single board computer 720 (shown in FIG. 6) inside tool posts 62a, 62b interfaces with programmable modules (smart boards) 54a, 54b and verifies that the proper connections were made. Next, the circuit element 64a is tested to ensure that it is functioning properly and there are no faults in the wiring. A single board computer 720 in tool post 62b transmits information regarding verification and testing to augmented reality glasses 560. In this case, the circuit element 64a was placed correctly and tested successfully. Therefore, there is a green indicator light 650 virtually displayed above tool post 62b indicating a successful connection.

Figure 5:
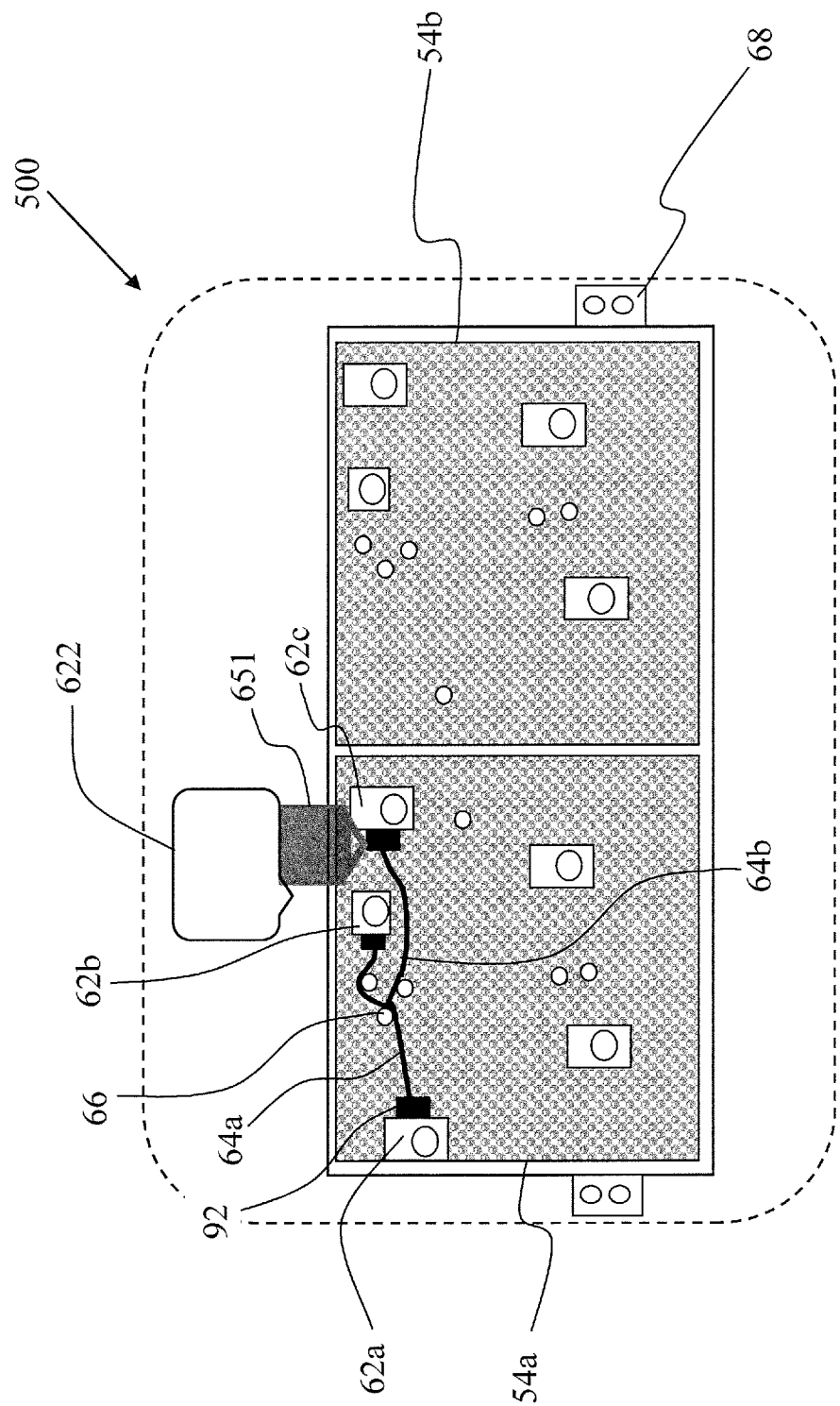
FIG. 5 is a view of the augmented reality display with a superimposed indication of failure of verification and testing of a circuit element.

Turning to FIG. 5, there is shown the augmented reality display 500 resulting from failure of verification and testing of a circuit element 64b. Connecting circuit element 64b to tool post 62c is the next step in the wire harness assembly 50. Once again, a single board computer 720 within tool post 62c transmits information regarding verification and testing to augmented reality glasses 560. In this case, the circuit element 64b was connected correctly but tested faulty. There is a red indicator light 651 virtually displayed above tool post 62c indicating failure. There is also a text box 622 display that provides instructions that informs the user that the circuit element 64b was placed correctly but there was a testing failure. Similarly, a red indicator light 651 will be virtually displayed if circuit element 64b was not connected correctly. The user can then disconnect circuit element 64b and connect it to whichever tool post 62 is proper.

To enable taping and loom assembly on the wire harness, corresponding instructions are displayed on the augmented reality glasses 560 at the appropriate step in assembly, and the user manually indicates completion of the taping or loom application step rather than an automated sensing. In addition, taping and looming steps are facilitated by the incorporation of stand-off blocks (illustrated schematically on each tool post 62 in FIG. 8B) which provide a separation of at least a half-inch (preferably at least 1.5 inches) between the plane of the smart boards 54a and 54b and the point on the block tool 62 where circuit terminals connect to the block tool 62. Such minimum separation helps to allow enough space for assembly personnel to fit their fingers beneath the wire assembly to enable taping and looming.

Another possible feature of the augmented reality glasses is a camera device and a transmitter. The camera can view the wire harness assembly 50 and capture images during the assembly process. The transmitter can send images to the computer system 40 so that it can verify the connections of circuit elements 64. In this manner, the camera can act as a redundant verification to the primary verification executed on harness assembly table 52 and provided by tool posts 62.

Figure 6:
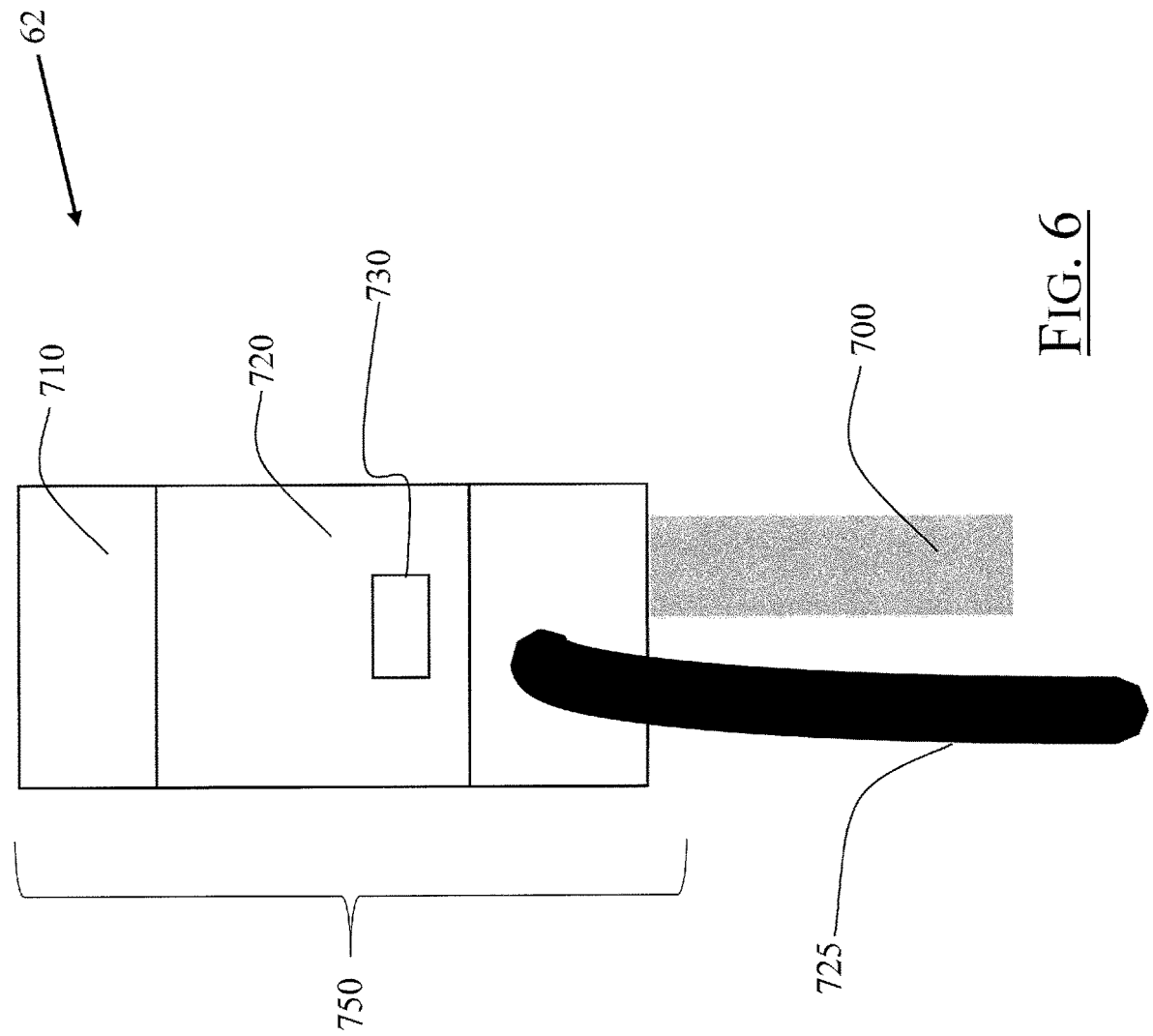
FIG. 6 is an overhead view of a side of a tool post disconnected from an assembly.

Turning to FIG. 6, there is shown an overhead view of a side of a tool post 62 disconnected from an assembly. A support post (aluminum shaft) 700 protrudes from tool post 62 through the top surface of a smart board (such as programmable module 54a). Tool post 62 preferably incorporates a single chip set 730 with orthogonal accelerometers that enables tool post 62 to report its orientation. In alternate embodiments, in order to determine the placement of tool post 62, and as a backup for determining the orientation of tool post 62, the bottom end of support post 700 can be cut in a specific way in order to reflect light in a preferential direction from an infrared ("IR") emitter in the center of each smart board orientation detection array. This enables IR optical sensors inside the smart board to determine which way the tool is pointing. Aluminum is preferably used as the material for support post 700 because of its IR reflectivity. Steel and stainless steel absorb much more IR and would not be able to function as a support post 700. A clamp (not shown) can be used to affix tool post 62 to the top surface of a smart board. Although not shown, other methods of securing the position of tool post 62 may be used. For instance, a metal plate may be positioned below the surface of the programmable modules 54a, 54b. At or near the bottom surface of tool post 62, there may be positioned a rare earth magnet. Upon placement of tool post 62, the magnet contacts the metal plate, thereby securing tool post 62 in place.

By industry standards, connector blocks are designed to receive a particular wire harness connector. Here, the connector block 710 is modified with hollow contact test probes which can transmit light into each connector cavity. The connector block 710 also has a locking device in order to retain wire harness connectors 92, and other sensors to check the status of various locks and other accessories that may be installed into the harness connector 92.

Another major feature of tool post 62 is the single board computer 720 (inside tool post 62) that interfaces with a smart board and acts as an interpreter between the various connector test contacts and the system network. A cable 725 connects the single board computer 720 to the smart board. The single board computer 720 also monitors connector accessory and lock switches and reports their statuses to the network. Additionally, the single board computer 720 also routes test signals delivered via the network to the appropriate connector cavity, and evaluates electrical characteristics at each contact to determine whether or not they might be connected via the harness assembly to other tool posts and connectors distributed over the smart board 54. This process enables the system to perform continuity, tensor impedance, and frequency response tests between cavities of multiple connectors installed at various locations across the smart board 54 during wire harness assembly. The network of multiple single board computers 720 is able to test for errors at all points in a wire harness assembly 50 and effectively take "snapshots" of the whole smart board 54. Electrical shorts can be specifically identified and illuminated so that the user can make any necessary adjustments.

Additionally, tool post 62 has a high intensity LED board (not shown) that accepts signals from the single board computer 720 and illuminates various portions of the tool post 62, along with the cavity fiber optics. An enclosure 750 mounts the support post 700, clamp, computer circuit boards 720, and connector block 710 together. At least one push-button switch 621 (not shown here) is mounted to the enclosure 750, which allows the user to respond affirmatively to prompts.

Figure 7:
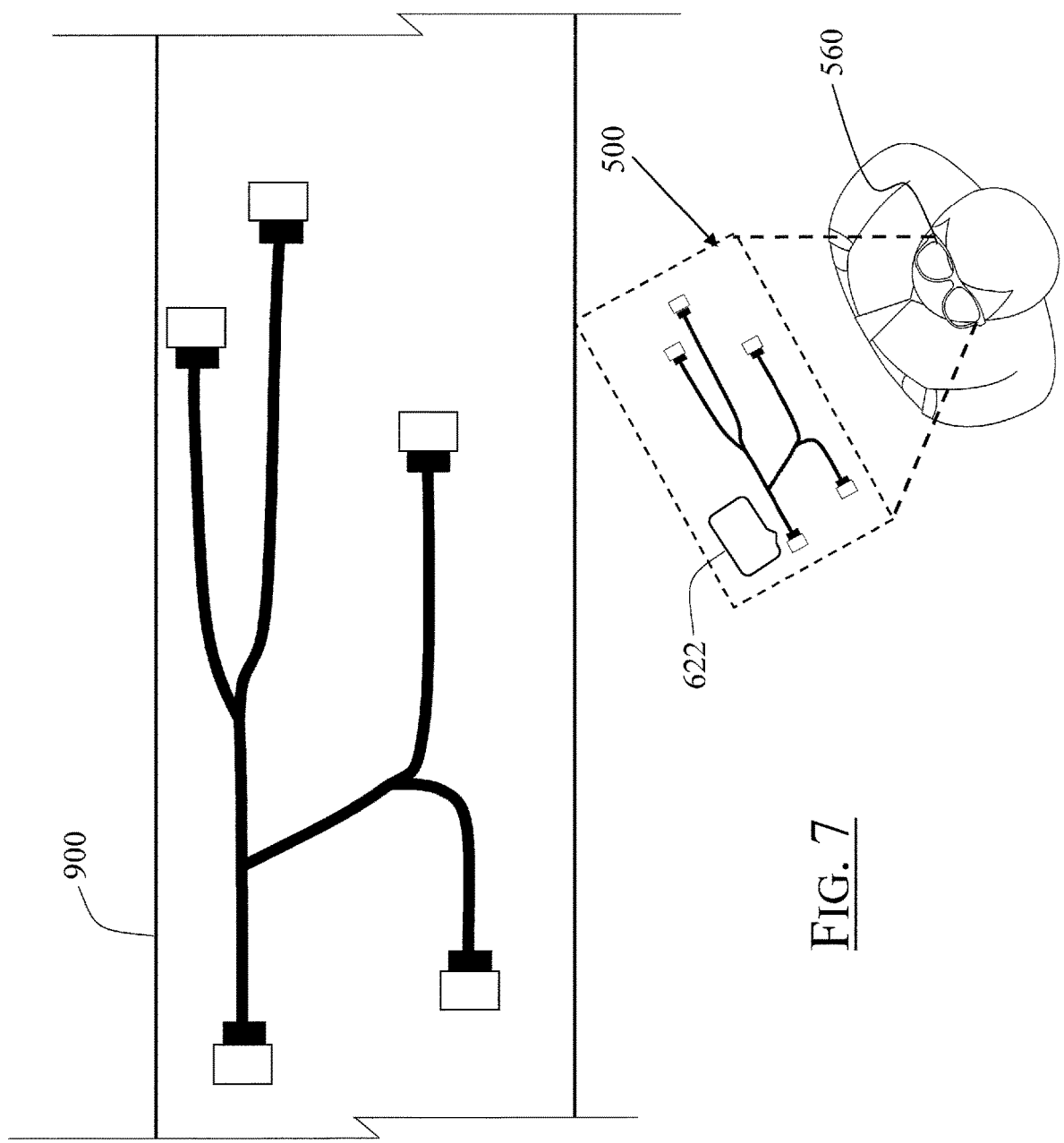
FIG. 7 is a view of use of the augmented reality display in a field installation.

In alternative or supplemental embodiments, the system operates in another mode where instead of or in addition to the wire harness assembly on the board, there are one or more wire harness terminations or connections that are completed in the field, particularly at or near the time of installation of the wire harness assembly in the equipment for which the wire harness assembly is made. For example, as illustrated in FIG. 7, there is shown an open panel 900 on an aircraft wherein a wire harness assembly is to be installed. Using augmented reality glasses 560, an installer is able to view the relevant interior portion of the aircraft, and augmented reality display 500 superimposes the images of the wire harness assembly components and the appropriate connections are also highlighted in the augmented reality display 500. Furthermore, as with the embodiment described in FIG. 3A, a text box 622 is shown on augmented reality display 500 to provide written instruction to assist the installer in making the appropriate connections. Using augmented reality glasses 560 serves to reduce or prevent faults and misconnections in the field when installing a completed wire harness assembly.

Figure 8A:
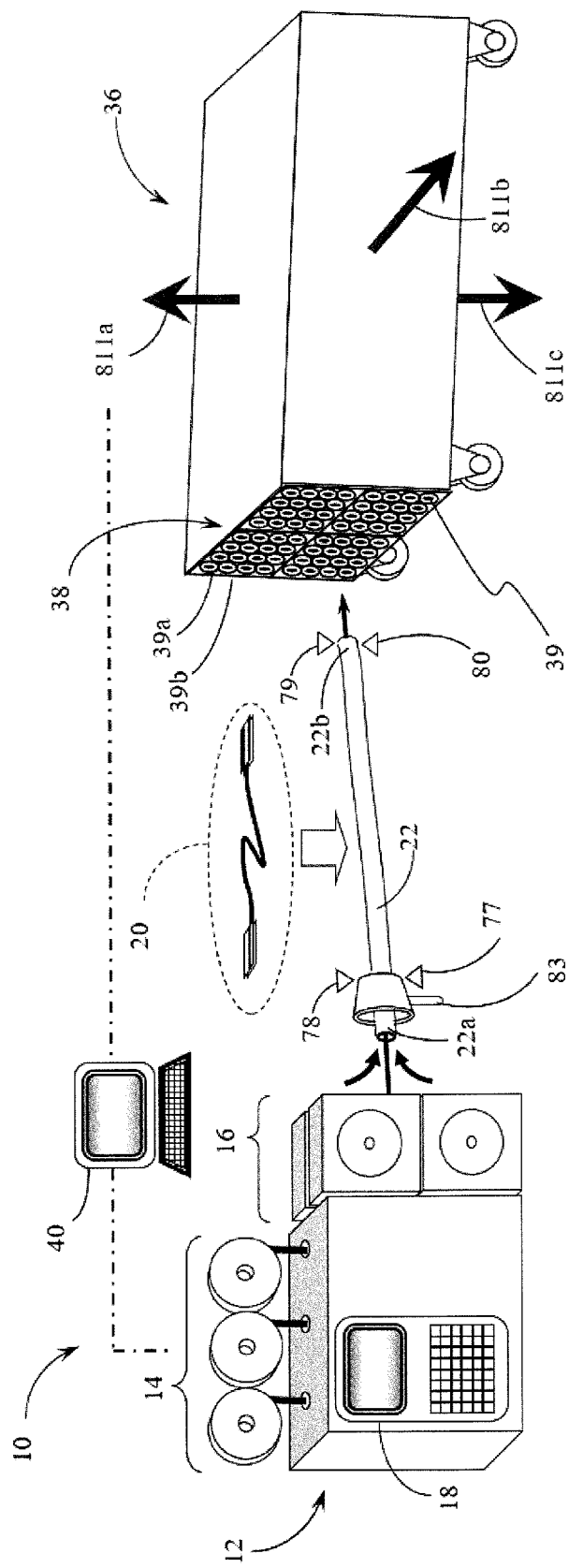
FIG. 8A is a partially schematic perspective view of the circuit manufacturing sub-system (C&C centers) of the present invention.
Figure 8B:
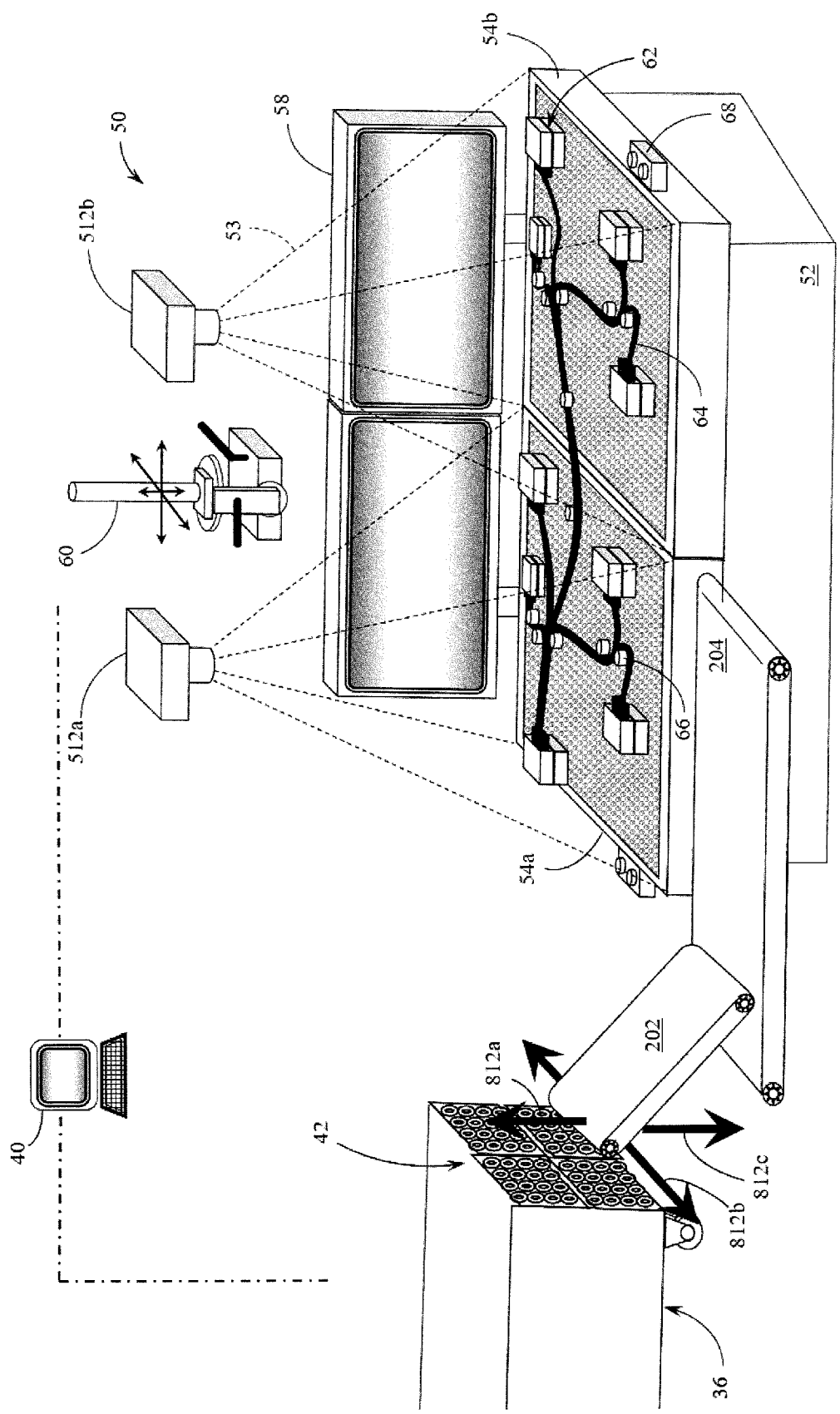
FIG. 8B is a partial schematic perspective view of the wire harness assembly sub-system (assembly table) of the present invention.

Reference is now made to FIGS. 8A & 8B for an overview of the various sub-systems that collectively are engaged in the overall process for the production of wire harnesses according to the present invention. FIG. 8A is a partial schematic view of the circuit manufacturing sub-system (C&C centers) 12 of the present invention involving the manufacture of the individual wire/terminal circuits 20 that collectively go together to make up a wire harness. In general, reference herein to a circuit 20 refers to the manufactured combination of a length or lengths of wire provided with (where applicable) one or more terminal ends (typically one length of wire with terminals at each end), that are collectively gathered into and make up the components within a wire harness. The terminal ends are variable in configuration and may simply involve a wire end stripped and tinned (with solder) for purposes of later attachment to a terminal block or circuit board. In most instances, however, a circuit comprises a length of wire that terminates at each end with a crimp-on metal terminal, typically of a pin or spade type. The crimp-on terminals may be either male or female. These metal terminals are most frequently designed to be collectively integrated into what will herein generally be referred to as a connector, which forms the end of a bundle of wires within a wire harness.

FIG. 8A shows the circuit manufacturing sub-system 10 as incorporating automated C&C center 12. This C&C center is in turn associated with indexed circuit storage system (cart/magazine) 36. These basic sub-systems collectively serve to manufacture the circuit elements utilized in the production of the wire harness and store them, preferably in a manner that can be readily and robotically retrieved for final assembly. Automated C&C center 12 is preferably a combination of subsystems assembled from a number of different commercially available automated wire cutting systems and automated stripping and crimping machines as well as wire labeling systems. Numerous manufacturers are known with various tools (for example, the Schunk-Minic, Schleuniger and Curti lines) that can be combined to achieve the described functionality of C&C system 12. The C&C center 12 preferably includes an array of wire supply reels 14 (auto feed) and an associated array of wire terminal supply cartridges (rolled bands of pre-cut sheet metal terminals with tabs, often referred to as "bandolier" rolls) 16.

Although some of the different supply reels 14 have different wire gauges, insulation and ratings than other reels 14, as is input and known by the programming of C&C system 12 (or that of the overall system 10), the wire insulation on all the wire supply reels 14 of C&C center 12 is preferably blank and of a white (or, alternatively, an assortment of solid pale colors) so that a wire label print can be applied to all the circuits 20 by C&C center 12 as the circuits are being cut, stripped and crimped. Tag labels as are known in the industry may also be applied by C&C center 12, to the extent required in the circuit specifications. Although not illustrated, those of skill in the art will understand how C&C center 12 is adapted to perform such label printing and application before the circuits 20 are stored in buffer 36.

Automated C&C center 12 will typically have at least one means for programming the device. The device may be programmed by operator commands entered into C&C center programming terminal 18. In another embodiment, automated C&C center 12 may be programmed from a remote data input terminal device 40. In yet another embodiment, automated C&C center 12 may be programmed by importing files from CAD software 104 (shown in FIG. 11).

Automated C&C center 12 produces a completed wire/terminal circuit 20 of a length, gauge, and terminal type, as specified by the programming provided to automated C&C center 12. Such programming is versatile and can direct automated C&C center 12 to produce a large number of a single type of circuit 20 or a long list of entirely distinct circuits that together might be eventually bundled to form a wire harness. In the present invention, a very efficient operation of automated C&C center 12 would be to produce a long list of individual circuits required to construct one particular type of wire harness. The C&C center may produce a number of circuit sets that are indexed and stored (as described in more detail below) and then later utilized to produce a number of the same type of wire harness.

Figure 13A:
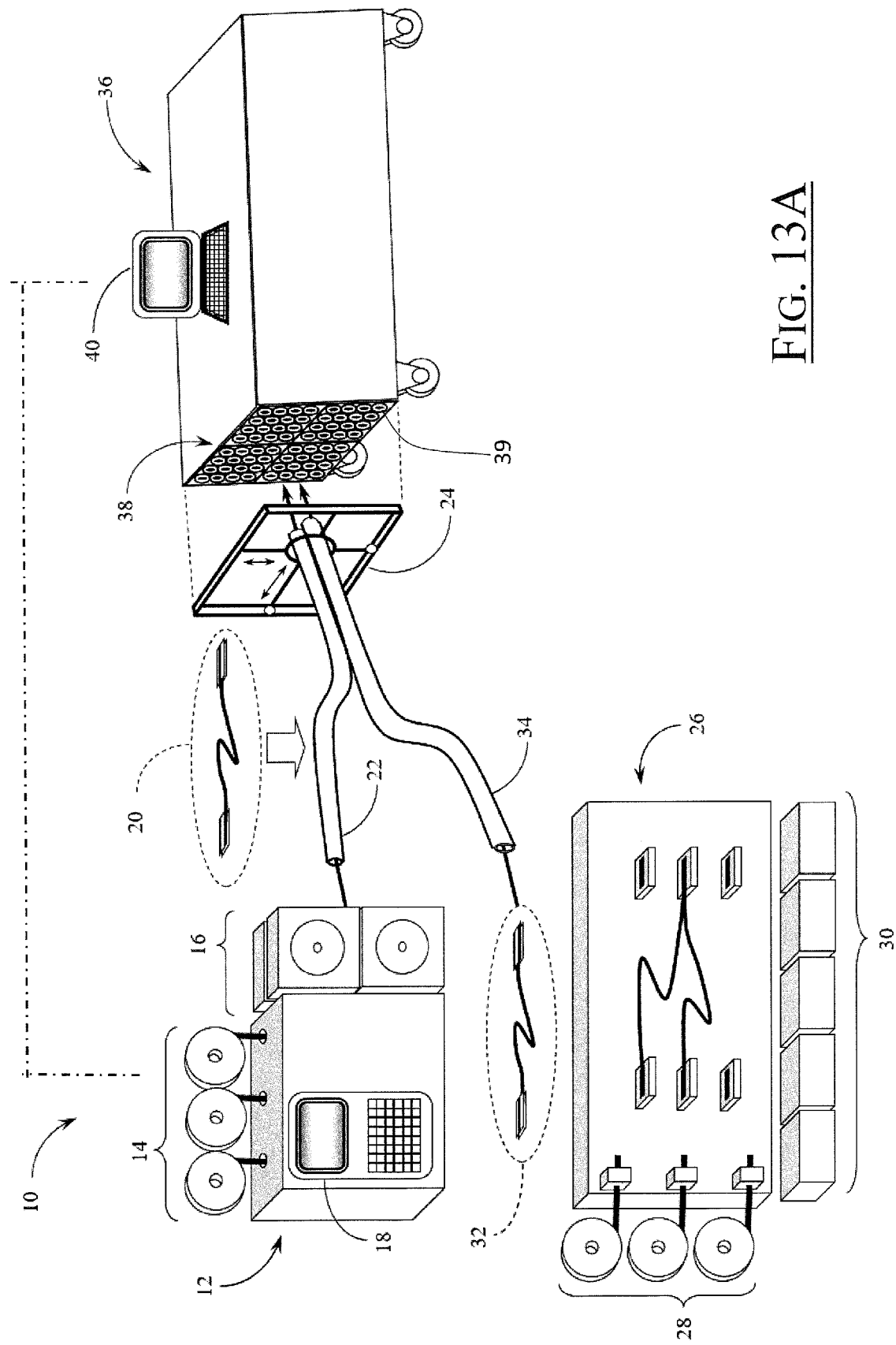
FIG. 13A is a partially schematic perspective view of an alternative embodiment of the circuit manufacturing sub-system (C&C centers) of the present invention.

Automated C&C center 12 provides a completed wire/terminal circuit 20 which is delivered into an indexed circuit storage system 36 by way of an associated pneumatic conduit 22 and a circuit indexing sub-system 24 (shown in FIG. 13A). The indexed circuit storage system 36 is preferably embodied as a magazine, also referred to as a "buffer," that includes numerous single-circuit containers 39 into which the production system deposits individual circuits 20, storing a record of which circuits 20 or types of circuit 20 are stored in which containers 39 so that those circuits 20 can later be retrieved from the buffer 36 when needed to make the final wire harness assemblies. Although some of such containers 39 may be sized differently than others according to the production needs, in the most preferred embodiment, such containers 39 are embodied as an array of identical tubes 39. Each such identical tube 39 is long enough to contain the longest wire that would be required in the wire harness batch being assembled (ten feet is typically sufficient) and is sized roughly ⅝ or 9/16 of an inch in inside diameter so that the largest of typical circuit terminals fit loosely within the tubes 39 but are still within fairly close tolerances in order to optimize space as well as the efficiency of the pneumatic system used to move the circuits 20 into and out of each tube 39. The tubes (or at least their interior surfaces) are preferably made of a low-friction material such as PVC or better in order to minimize the possibility of a circuit 20 hanging up or getting stuck in a tube 39 when the pneumatic conveyance system is attempting to move it.

Buffer 36, hence, is configured with a large array of linear tubes 39, each of which preferably only holds a single circuit 20, configured in a fixed, parallel arrangement. (It is envisioned that alternative, albeit less beneficial, embodiments may hold one or more completed wire/terminal circuits 20 in individual containers 39 while still appreciating some of the benefits of certain aspects of the invention.) This array of storage tubes 39 operates in conjunction with circuit indexing sub-system 24 such that every tube 39 within the array 38 of the cart/magazine is identified and indexed to contain a known type of circuit element 20. In this manner, indexed circuit storage system 36 may be loaded with a full circuit element set appropriate for the manufacture of one or more particular batch(es) of wire harnesses. Wire harnesses may of course come in a variety of configurations having less than ten circuit elements to hundreds of circuit elements. Indexed circuit storage system 36 is designed to accommodate simple or complex wire harness circuit sets.

The combination of a circuit indexing sub-system 24 (shown in FIG. 13A) and pneumatic conduit 22 deliver completed wire/terminal circuits 20 from the automated C&C center 12 into a properly indexed storage tube 39 within indexed circuit storage system 36. In one embodiment, a circuit is transported from the automated C&C center into storage system 36 by pneumatic tube 22. Circuit 20 enters tube 22 at 22a where optical sensors 77 and 78 detect its entry into tube 22. Device 83 is a means for supplying pneumatic pressure into tube 22 to transport circuit 20 through tube 22 from entry at 22a to exit at 22b. As the circuit exits tube 22, optical sensors 79 and 80 detect its passage. In one embodiment, circuit 20 is inserted into a particular tube, for example tube 39a, in storage system 36 by moving storage system 36 such that the longitudinal axis of tube 39a is generally aligned with the longitudinal axis of pneumatic tube 22 and the receiving end of storage tube 39a is close enough to discharge end 22b to reliably receive the circuit. Arrows 811a, 811b, and 811c show how storage system 36 is moved in an X-Y coordinate system to align a receiving tube with the discharge end 22b of tube 22. Movements of storage system 36 are controlled by a computer system that maintains the index system and is able to move storage system 36 across the X-Y coordinate system to align any individual tube to receive a circuit. The vertical surface plane of storage system 36 (formed by the tube ends including tube 39a and 39b) is maintained in a vertical orientation which results in the surface plane being generally normal to the longitudinal axis of pneumatic tube 22. To insert a circuit into tube 39b, storage system 36 is moved vertically, but not horizontally, so that the receiving end of tube 39b is aligned with discharge end 22b and is ready to receive a circuit. As mentioned above, the entire indexing system may be programmed and may be controlled by way of a computer system 40. In some embodiments, a computer system 40 may be located on storage system 36. In a preferred embodiment, computer system 40 is a computer server system. Regardless of where computer system 40 is located or its particular configuration, each completed wire/terminal circuit 20 from the respective C&C center 12 may be directed into a known and indexed storage tube 39 where it may be held until such time as the manufacturing of that particular wire harness assembly is carried out.

In some embodiments, the indexes and circuit descriptions are stored in a memory device downloaded to and physically located in or on storage system 36 so that the cart can be temporarily stationed in a holding area and its data can be retrieved whenever it is ultimately wheeled into position for wire harness assembly (as depicted in FIG. 8B). In a preferred embodiment, however, the data pertaining to a particular buffer 36 loaded with circuits 20, including the descriptive information for each circuit 20 and the location of its tube 39 within storage system 36 is stored in computer server system 40. Each storage system 36 entity is marked with a bar code that uniquely identifies the storage system. With the bar code identifier, the index system, and the circuit descriptions, the production system identifies each circuit regardless of where it is stored.

In a first preferred embodiment of the present invention, each of the storage tubes 39 associated with indexed circuit storage system 36 may be designed to retain a single circuit element 20 for later delivery during the assembly of the wire harness. Alternate embodiments of the present invention anticipate the utilization of storage tubes 39 capable of retaining a number of like circuit elements 20 for later use and delivering such circuit elements 20 one at a time in a repetitive manner. Therefore, the index circuit storage system (cart/magazine/buffer) 36 may be configured to receive, store, and deliver a full circuit element set appropriate for the manufacture of a single wire harness or, in an alternate embodiment, the same cart 36 may be configured to receive, store, and deliver ten or more sets of circuit elements 20 by repeatedly drawing out a full set for the manufacture of a wire harness followed by second and subsequent full sets all from the same storage cart 36.

Reference is now made to FIG. 8B for a detailed description of what is essentially the second half of the wire harness production process. The sub-systems described in FIG. 8A above, produce the building block components that are to be assembled into the final wire harness product. These building block components are, as described above, circuit elements 20 comprising lengths of wire with terminal ends attached. These completed wire/terminal circuits are stored, either for a period of time or for as long as it takes to move the storage cart 36 to the wire harness assembly sub-system 50. FIG. 8B shows the same indexed circuit storage system 36 as shown in FIG. 8A, this time providing stored circuit sets to the wire harness assembly sub-system for the purposes of completing the manufacture of the wire harness. In the view shown in FIG. 8B, indexed circuit storage cart 36 is moved to a position adjacent the wire harness assembly sub-system 50. In some embodiments, indexed circuit storage system 36 includes, as indicated above, a computer system 40 that facilitates the automation of the process of indexing, storing, and delivering the circuit elements 20. In a preferred embodiment, the circuit descriptions and indexes are stored in a computer server system 40. Also shown in FIG. 8B is storage cart output port array 42 similar in structure to the storage cart input port array 38 shown in FIG. 8A. In one embodiment of the present invention, storage cart output port array 42 may comprise the same array of ports 39 as storage cart input port array 38, and cart 36 is simply turned around for receipt or delivery of the circuit elements. Alternately, these storage cart port arrays 38 and 42 may comprise opposite ends of the mobile indexed circuit storage systems (cart/magazine) 36.

As with the input of circuit elements 20 into indexed storage circuit system 36, the output or delivery of the circuit elements 20 is carried out by effectively reversing the indexing process and selectively withdrawing the appropriate circuit element 20 from the storage cart 36 to be delivered to the wire harness assembly sub-system 50. In at least one embodiment, computer controlled electric motors position storage system 36 so that the tube with the next circuit required in the wire harness is aligned with a pneumatic tube that ejects circuit element 20 onto conveyor belts 202 and 204 to deliver the circuit element 20 to assembly sub-system 50. This delivery is again carried out by way of pneumatic conduit 46 (shown in FIG. 13B) which withdraws a circuit element 20 from storage system 36 and delivers it to wire harness assembly sub-system 50 for use in conjunction with the assembly process.

The actual assembly of the wire harness is carried out manually, although this assembly process is directed, prompted, tested, and verified automatically in conjunction with the elements of the system of the present invention as described in more detail below. While assembly personnel manually receive circuit elements from the circuit indexing sub-system 44 by way of the pneumatic conduit 46 as described above, the process of placing the circuit element 20 onto the assembly table 52 and making the appropriate connections is automatically guided and confirmed by the systems and methods of the present invention.

The assembly table of the present invention is generally comprised of assembly table support frame 52 which positions and supports one or more assembly table programmable modules represented by 54a & 54b in FIG. 8B. In the preferred embodiment of the present invention, a versatile system might incorporate as many as twelve assembly table programmable modules, with four layout boards per module, that may be used individually or collectively depending upon the size and complexity of the wire harness being constructed. These table modules are interconnectable and may be used separately or collectively according to the requirements of the system and the personnel handling the wire harness assembly.

Figure 8C:
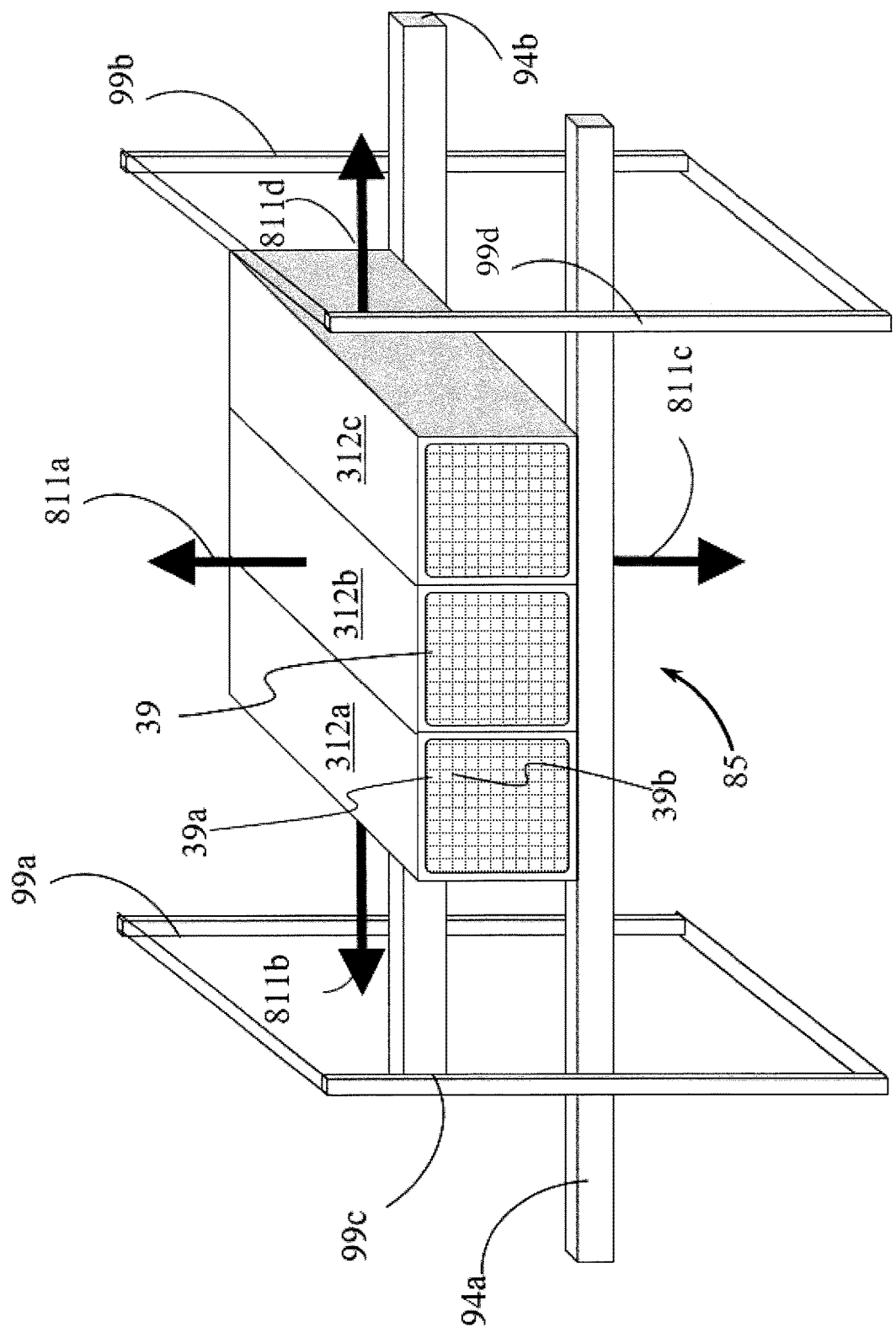
FIG. 8C is a perspective view of a computer-controlled X-Y indexing platform 24 for moving each of three storage buffers to direct each individual circuit from the crimp center into a unique corresponding tube location in the buffers.

Reference is now made to FIG. 8C for a more detailed description of a preferred embodiment of the circuit transfer system of the system and method of the present invention. FIG. 8C is a perspective view of a computer-controlled X-Y indexing platform 85 for moving each of three storage buffers 312a, 312b, 312c to direct each individual circuit element 20 from the crimp center 12 into a unique corresponding tube 39 located in the buffers 312a-312c. A such, X-Y indexing platform 85 serves as one of the two circuit indexing sub-systems utilized to deliver completed circuit elements into and out from the mobile storage system 36 (cart/magazine) of the present invention. It is understood that, as discussed above, such an indexing sub-system would preferably be positioned in conjunction with both the circuit manufacture sub-system (the C&C centers) and the harness assembly sub-system (the soft-tool assembly tables) and would provide the manner of directing completed circuit elements 20 into the mobile indexing storage cart 36 as well as providing delivery of the same from the mobile cart 36 to the harness assembly table 52.

Those skilled in the art will recognize that the system may preferably include two such circuit indexing sub-systems, one for delivery of the manufactured circuit elements 20 into the storage cart 36, as shown in FIG. 8A, and one for delivery of the indexed circuit elements 20 from the storage cart 36 to the assembly table 52, as partially shown in FIG. 8B. Alternately, the storage cart might retain a single array of ports that serve as both the input and output ports for reception and delivery of the various circuit elements 20 stored within the mobile cart 36. In other words, the circuit indexing sub-system 85 shown in FIG. 8C could also serve as the circuit indexing sub-system 24 described above for receiving manufactured circuit elements 20 into the cart 36. It would be a simple matter of connecting and disconnecting the pneumatic hoses associated with each of the stations discussed above and appropriately programming the X-Y indexing and sorting system to either direct (pneumatically) a just completed circuit element 20 into the storage cart 36 or to withdraw a previously indexed circuit element 20 from the cart 36.

FIG. 8C shows one embodiment of the present invention and depicts storage systems 312a, 312b, and 312c that are positioned by circuit indexing system 85. System 85 uses commercially available means such as computer controlled electric motors operating lift and side-to-side conveyor mechanisms to move the storage systems 312a-312c. Preferably, electric motor screw jacks at the base of each of the four vertical frame members 99a-99d control the coordinated vertical movement of forward and rear support beams 94a & 94b in the (vertical) Y axis (arrows 811a, 811c), which in turn support the three buffers 312a, 312b, and 312c. Simultaneously, coordinated forward and rear chain link belt drives (not shown but understood by those of skill in the art) within the forward and rear beams 94a & 94b preferably control movement in the (horizontal) X axis (arrows 811b, 811d).

The respective motions are controlled and recorded so that the individual tube number and location is recorded in a storage system data structure as previously described. For example, when a circuit element 20 is prepared by automated C&C center 12 and ready for transfer into a storage system tube such as 39a, computer-controlled circuit indexing system 85 positions tube 39a to receive the circuit. If the next circuit is to be stored in tube 39b, circuit indexing system 85 moves the platform vertically to prepare tube 39b to receive the next circuit element 20. Those skilled in the art will be able to appreciate other means that could be used to position individual tubes to receive a completed circuit element 20 from the automated C&C center 12 or to transfer a circuit element 20 to assembly system 50.

In addition, the circuit indexing system 85 preferably and automatically creates an offset in the height of the forward and rear beams 99a and 99b in order to take advantage of gravity in moving circuits relative to tubes 39, thereby creating a slight tilt in the slope of the buffers 312a-312c in order to minimize hang-ups in circuit conveyance. When used in the preferred embodiment, the buffer tilt (subtly illustrated in FIG. 8A) is at least four degrees when viewed from the side. Ideal buffer tilt angles for a given pneumatic conveyance system can be determined by experimenting to find the angle that most closely matches the natural trajectory of a typical circuit 20 exiting end 22b of tube 22, and the computer control system is adapted to automatically introduce that determined tilt to favor the direction of conveyance.

Figure 9:
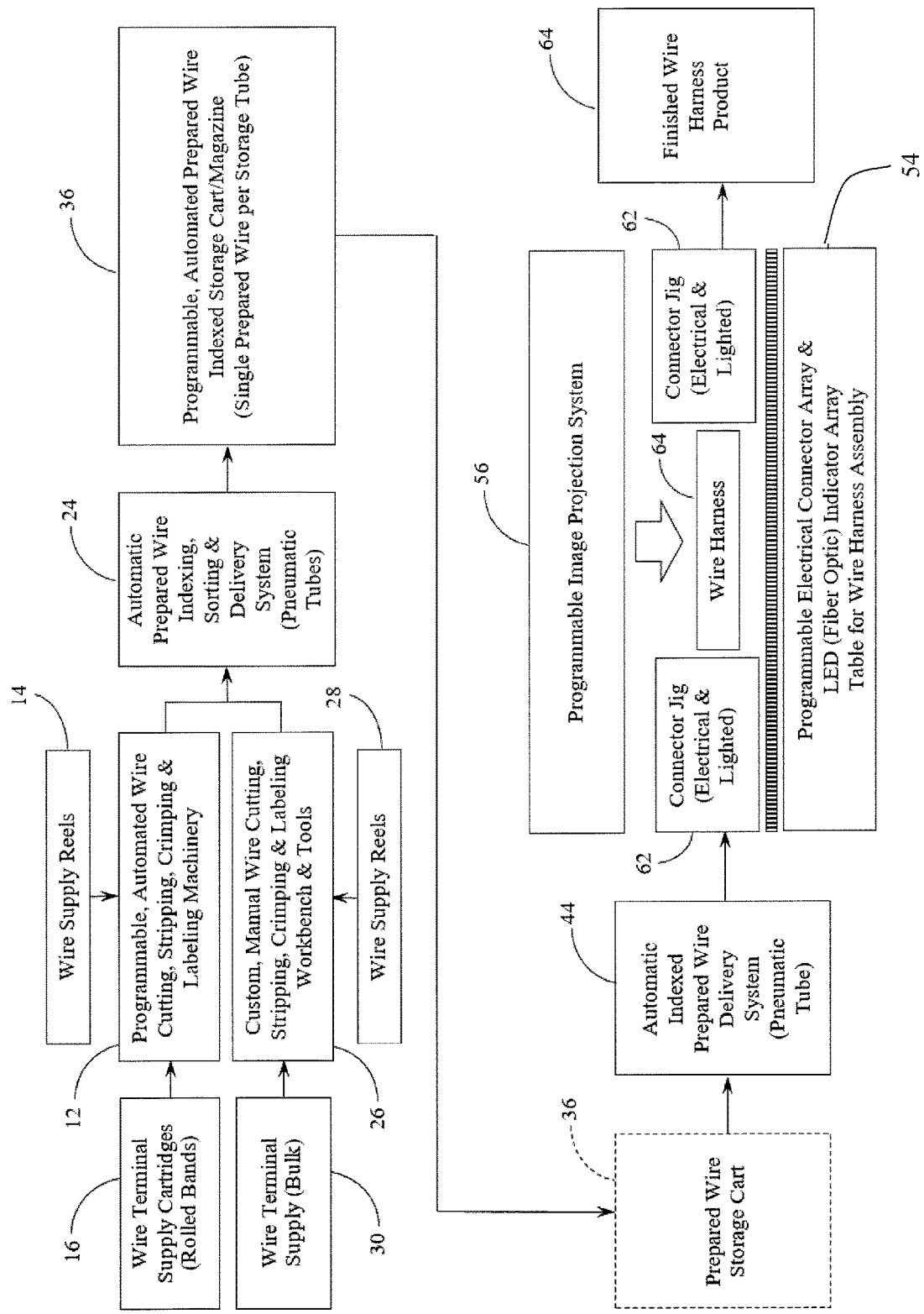
FIG. 9 is a schematic block diagram of the circuit manufacturing and wire harness assembly sub-systems of the present invention.

Reference is now made to FIG. 9 for an overview of the flow of the production process associated with the system and method of the present invention. FIG. 9 is a schematic block diagram of the circuit manufacturing and wire harness assembly sub-systems of the present invention. While FIGS. 8A, 8B, & 8C provide a better overview of the structural hardware requirements of the system, FIG. 9 characterizes the procedural or process flow operable in conjunction with the sub-systems in a more concise view. In FIG. 9, automatic C&C center 12 is provided with wire supply reels 14 and wire supply cartridges 16 as described above. The manufacturing process flows from the C&C center to circuit indexing sub-system 24. This sub-system 24 provides automatic prepared wire indexing, sorting, and delivery by way of the combination of pneumatic ejector tube 22 and the X-Y indexing frame/track for buffer 36 (described in detail below).

The indexing, sorting, and delivery system, either 24 or 85, delivers the prepared circuit elements to indexed circuit storage system (cart/magazine/buffer) 36. Again, as discussed above, this potentially large number of circuit elements 20 produced and stored may represent all of the necessary circuit elements for the construction of a single wire harness or may represent multiple circuit element sets appropriate for the manufacture of multiple wire harnesses. In any event, these circuit elements 20 are delivered to the programmable, automated, prepared wire index storage system (cart/magazine/buffer) 36 that, in the preferred embodiment, is a mobile cart capable of being moved from an initial location adjacent the C&C center sub-systems 12, 22 to a location adjacent the assembly table sub-system 50. This movement is represented in FIG. 9 by the line connecting the solid outline circuit storage cart 36 to dashed outline circuit storage cart 36. Essentially, the top part of FIG. 9 represents the C&C center sub-system(s) 12, 22 whereas the bottom part of FIG. 9 represents the wire harness assembly sub-system 50.

Once the prepared and indexed circuit elements 20 are stored in indexed circuit storage system 36, they are moved to the assembly location where they are delivered to the wire harness assembly table 52 by way of circuit indexing sub-system 44. In a manner essentially the reverse of the action associated with circuit indexing sub-system 24 or 85, indexing sub-system 44 provides the automatic, indexed, prepared circuit wire delivery, by way of X-Y extraction (not shown in FIG. 9) to the assembly table components of the system of the present invention. Indexing sub-system 44 is discussed below, but as noted above, essentially the reverse action of circuit index system 24 or 85 may be used to retrieve circuits in order from storage system 36 for presentation to the assembly person via conveyor belts 202 and 204. When the retrieval system, whether using system 44, system 85, or a variant, delivers a circuit to the assembler, the delivered circuit element is handled by the assembly personnel and is placed on the assembly table 52 by connection to block tools (connector jigs) 62, which in the preferred embodiment are sequentially illuminated (as described below) and electrically connected for easy identification and for subsequent electrical testing. Also as mentioned above, programmable assembly table modules 54 incorporate programmable electrical connector arrays and LED (fiber optic) indicator arrays for the purpose of facilitating and guiding the wire harness assembly.

Wire harness 64 is therefore assembled by placement of the individual circuit elements 20 between the connector jigs 62. The method of progressing step by step through the process of assembling the circuit elements 20 into the wire harness 64 is assisted by at least one of the following: 1) augmented reality glasses 560 providing augmented reality display 500; or the programmable image projection system or harness assembly sequence projectors 56 (shown in FIGS. 13b and 14). Once the wire harness 64 has been completely assembled (and tested and bundled), the finished wire harness product 64 is removed from the table 52 and is now ready for packaging and delivery.

Figure 10A:
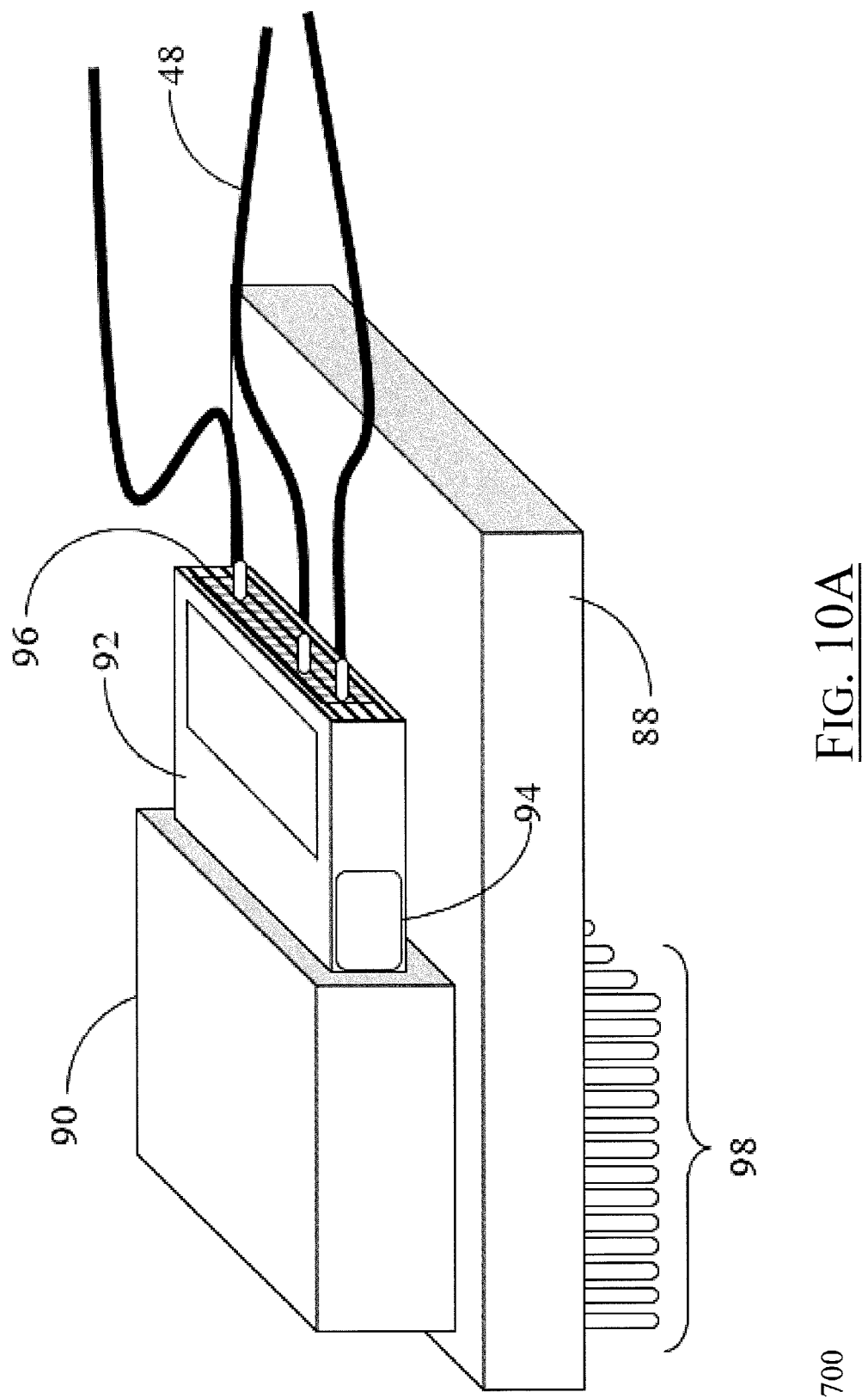
FIG. 10A is a detailed perspective view of a typical block tool (connector jig) for use on the assembly table of the present invention.

Reference is now made to FIG. 10A for a more detailed description of the elements of the system of the present invention that facilitate the actual connection between a completed circuit element as described above and a connector block making up a terminal end of a portion of a wire harness assembly. As discussed above, wire harnesses are generally made of bundles of wire that are collectively gathered into a variety of different standard sized connectors which, when installed in the electronic or electrical devices associated with the wire harness, serve to appropriately connect the various components within the larger electrical or electronic device. As indicated, these connectors may be considered standard in configuration, although just as often there are unique or customized connector structures that must be utilized in a given wire harness configuration. In any event, it is an object of the present invention to provide an adaptor tooling base that allows a particular wire harness connector to be positioned on and connected to the programmable assembly table modules described above.

In the preferred embodiment, the assembly table modules 54 are constructed of large scale arrays of electrical and optical connections. These "breadboard" type platforms provide a programmable array of electrical connectors and fiber optic light conduits between a source (electrical or light) into the variously placed block tools positioned on the assembly table programmable modules 54. Every different type of wire harness connector 92 (into which a bundle of completed circuit elements may be positioned) will have a specific block tool or connector jig that interfaces between the connector 92 and the assembly table programmable module 54. In the example shown in FIG. 10A, block tool (connector jig) 62 is configured to serve as an adaptor between the assembly table (not shown) and the wire harness connector 92 (typical). The connector interface 90 provides the specific connection between wire harness connector 92 and the standardized configuration of tool base and table interface 88. In the preferred embodiment, this specific tool base and table interface 88 provides on one side the appropriate connections through connector interface 90 to receive and retain the specific type of connectors shown, in this case wire harness connector 92. Connector 92 in the example shown has a connector wire circuit port array 96 positioned on a distal face so as to receive a number of individual wire/terminal circuits 48 that have been delivered to the wire harness assembly table. The assembly personnel take each of the wire/terminal circuits and insert a terminal end of the same into the appropriate connector wire circuit port positioned in port array 96.

Initially, block tool 62 is connected to the assembly table programmable module 54 by way of an array of block tool connection pins 98. As indicated above, these connections may comprise both electrical connections and optical or light connections for the transmission of not only electrical current (primarily for testing the established wire harness circuitry) but also for prompting of locations for assembly personnel placement of the individual wire/terminal circuits 48.

Figure 10B:
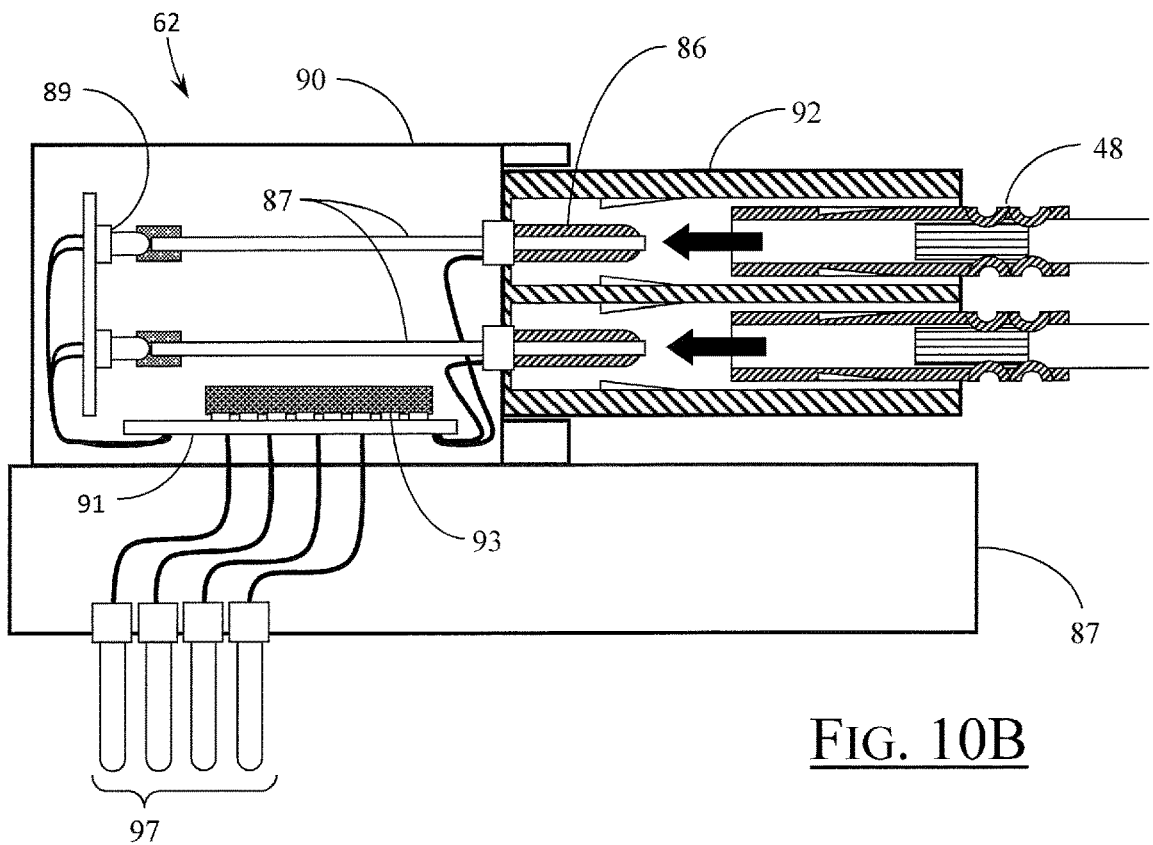
FIGS. 10B & 10C are detailed partial cross-sectional views of alternate embodiments of the block tool (connector jig) for use on the assembly table of the present invention.
Figure 10C:
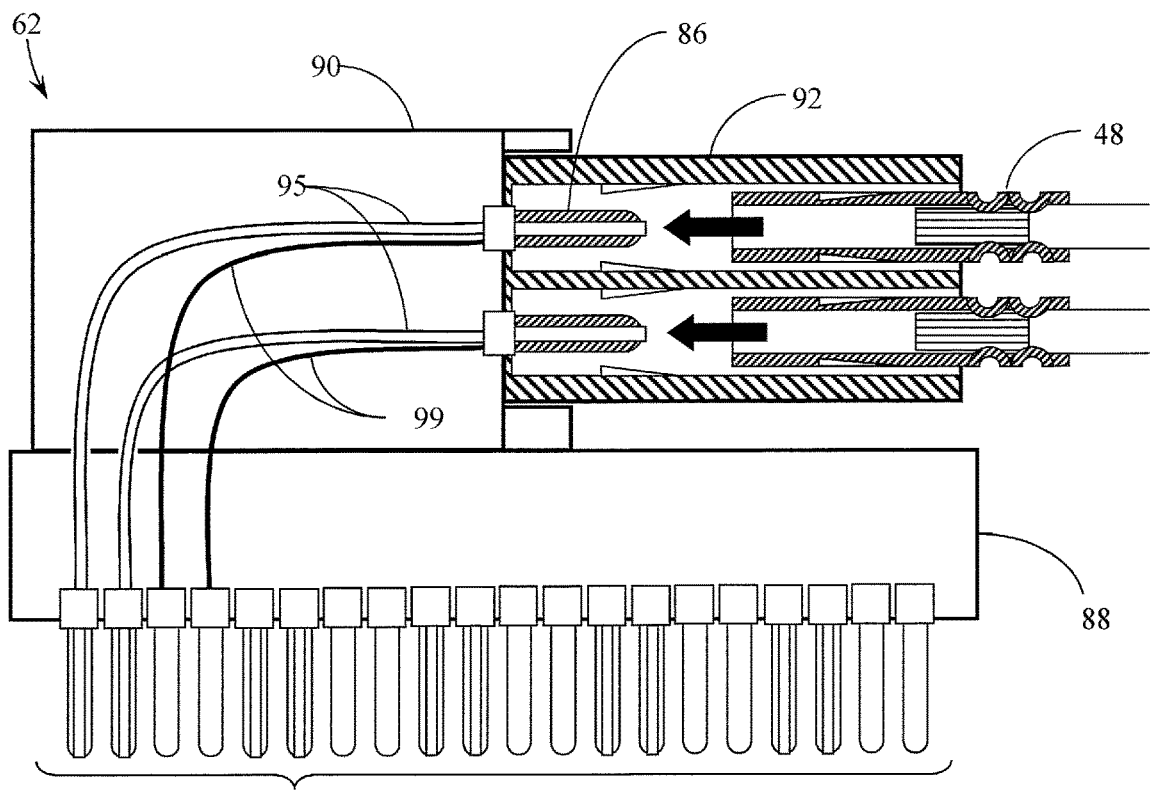

FIGS. 10B &10C show alternate embodiments for the internal structure of the block tools (connector jigs) and therefore imply alternate embodiments for the structure of the assembly tables. It is understood that the use of visual light prompts to assist with the proper placement of each of the wire/terminal circuits 48 can be achieved either by positioning lights (such as LEDs) within interface connector 90, as shown in FIG. 10B, which LED lights 89 shine by way of optical wave guides 87 through electrical test probe/ light prompt source 86, and then through connector 92 to the appropriate port opening for reception of a given manufactured circuit 48. Alternately, as shown in FIG. 10C, block tool 62 may simply connect by way of fiber optic light guides 95 to the appropriate insertion port with a programmed LED illumination from within assembly table programmable module 54. In other words, the light sources appropriate for prompting the proper insertion of a circuit into the connector, may originate either in the block tool itself (in which case, controller 93 positioned on microcontroller PC board 91 may serve to turn the light sources 89 on or off) or may originate within the assembly table itself, in which case fiber optic wave guides 95 in FIG. 10C would be required to carry such prompting light indicators to the appropriate port opening in the connector port array.

As indicated above, it is anticipated that the various standard sized connectors would each have a standard block tool or connector jig for use in connection with the assembly of a particular wire harness. It is anticipated that many such block tools or connector jigs would be pre-built and available for use with as many different types of connectors as would be typically constructed within the wire harnesses as assembled. In addition, generic block tools might be created to receive and retain circuits that are not directed through standard sized connector assemblies.

It will be understood by those skilled in the art that the various functions intended to be carried out by the block tools of the present invention may be carried out with a large number of connections (electrical and optical) between the block tool and the assembly table module (as shown in FIG. 10C) or may be effectively multiplexed through a small number of digital signal connections between the block tool and the assembly table (as shown in FIG. 10B). In other words, the block tool utilized in the present invention may be a simple ("dumb") connector for relaying the electrical and optical circuits originating from the assembly table module to the connector to facilitate its assembly and testing, or the block tools themselves may involve "smart" devices capable of receiving a digital signal from the assembly table module and translating that signal into the appropriate testing electrical currents or the appropriate optical prompts for directing the manufacture and assembly of the wire harness in association with the various connectors.

The present invention anticipates a range of structural components that place more or less complexity into the structure of block tool 62 varying from simple optical and electrical connections to complex digital devices capable of receiving coded signals from the assembly table and providing (or not providing) the appropriate or inappropriate optical prompts and electrical test currents. The advantages of a "smart" block tool include the ability to repair a faulty connection by simply replacing the block tool being utilized, as well as greatly simplifying the electrical and optical structures associated with the harness assembly table module configuration. With a smart block tool, communication between the block tool and the assembly table module may require little more than a single pair of electrical wires (or the two pairs shown in FIG. 10B). On the opposite end of the spectrum, a simple block tool that is little more than an array of electrical and optical conductors would require a much more complex array of similar conductors and connectors between the block tool and the programmable assembly table modules. In the latter embodiment, the assembly table modules would be much more complex with each individual electrical and optical connection being carried between the table and the block tools. While this simplifies the construction of the block tool itself (making the block tools much less subject to error), the structure significantly complicates the assembly table configuration and therefore makes it more difficult to troubleshoot and solve errors and problems in the electrical and optical connections. Various installations of the systems and methods of the present invention may dictate a preference for smart block tools and much simpler construction for the assembly table modules, while other environments may dictate the use of "dumb" block tools and "smart" configurations within the assembly table modules themselves.

Figure 11:
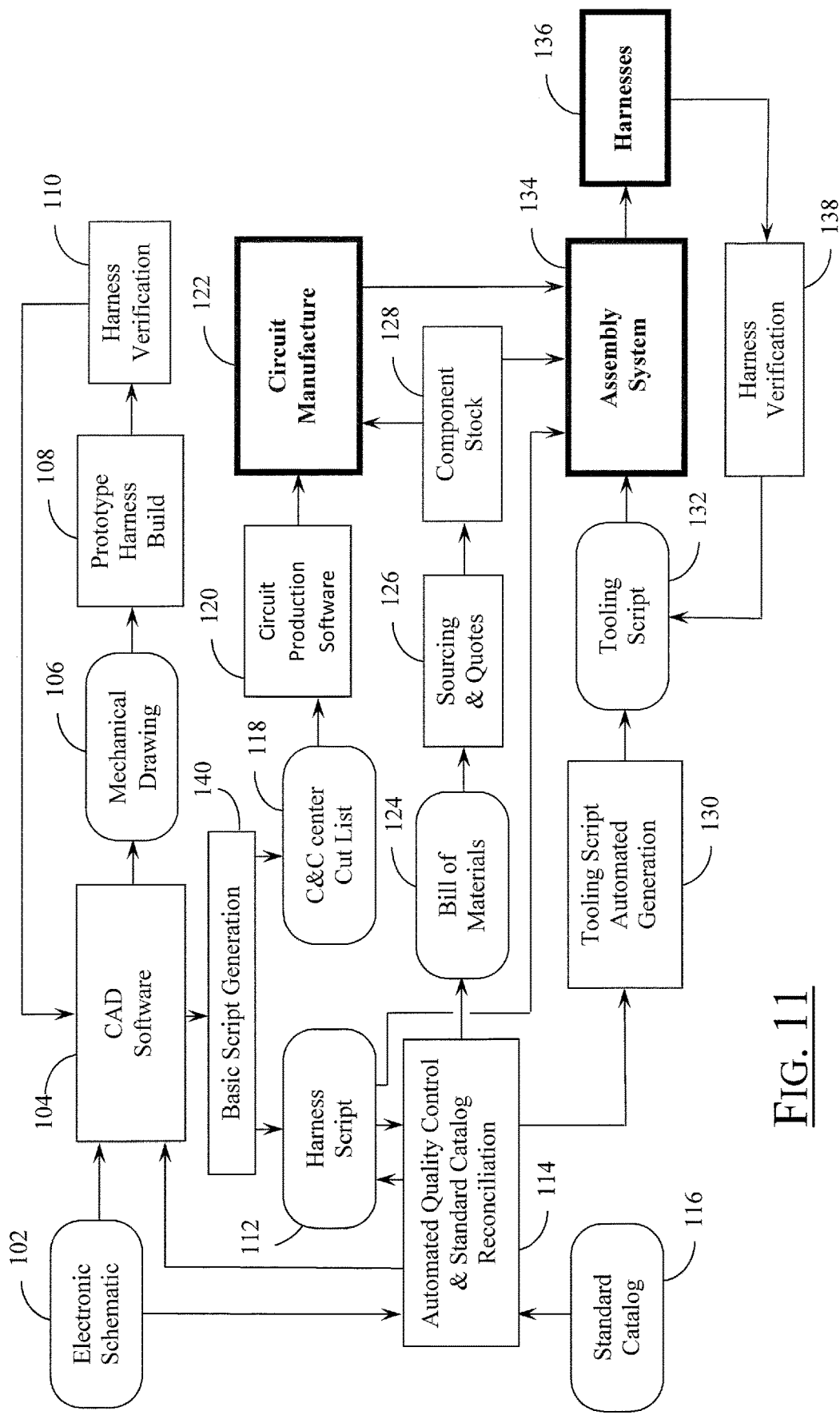
FIG. 11 is a mixed view hardware/software method flowchart of the overall system and method of the present invention.

Reference is now made to FIG. 11 for a broad overview of the entire system and associated methods of the present invention. FIG. 11 is a mixed view hardware/software method flowchart of the overall system and method of the present invention, showing the functional relationship between the various components within the system, the data flow within the system, and the time-based sequence of production method steps involved. In general, the elements shown in FIG. 11 may be identified according to the configuration provided for each component. The hardware sub-systems of the present invention are presented in bold rectangles (comprising the circuit manufacture sub-system and the harness assembly sub-system, as well as the harness itself). Functional operations are provided in non-bold rectangular blocks with directional arrows representing method flow. Oval shaped blocks in FIG. 11 generally reflect data, either assembled or programmed, utilized to carry out the manufacturing methodology of the present invention.

As indicated above, the fundamental hardware sub-systems of the present invention comprise circuit manufacturing sub-system 122 and wire harness assembly sub-system 134. The final goal of the overall system is the production of harnesses 136. The process carried out may generally be considered to start with the electronic schematic 102 which is an initial (generated) schematic of the final wire harness desired to be produced. A commercially available CAD software system 104 provides a variety of functions to the operation of the overall system and the production method, as augmented by novel custom software 140, 112, and 130 that produces machine readable scripts to dynamically propagate data throughout the production system. Initially, the CAD software 104 takes the electronic schematic 102 and produces a mechanical drawing 106 suitable for the prototype harness build 108. This prototype harness then goes through harness verification 110 with a resultant output that may modify, by way of CAD software 104 and automated production script generation process 140, the production harness instructions. This occurs generally at the creation of harness script 112 and C&C center cut list 118, both of which basic script generation 140 derives from CAD software 104.

In addition to the feedback loop provided by the prototype manufacturing process, CAD software 104 integrates the data associated with the electronic schematic 102 with the automated quality control and standard catalog information functionality 114 (again, software driven). This centralized quality control software component receives data from standard catalog 116, which in the preferred embodiment is a database of standard catalog information related to all of the various components that end up being assembled into the final manufactured wire harness. These components include wire gauge standards, terminal configurations, connector configurations, and so on. All of this information is provided by way of automated quality control and standard catalog reconciliation process 114 which provides the same through CAD software 104 to assist with the creation of harness script 112. A further confirmatory feedback loop is provided between harness script 112 and quality control and standard catalog 114.

CAD software 104, through the mechanisms described above, generates C&C center cut list 118 which directs circuit production software 120 to carry out the circuit manufacture 122. Circuit manufacture is, as discussed above with regard to the prior figures, the manner of assembling the building block components of the wire harness, namely the circuits comprising lengths of wire with associated wire terminals. This circuit manufacture 122 is carried out with elements from component stock 128 which has been established by way of a bill of materials 124 generated by sourcing and quotes 126, all of which derive from the automated quality control and standard catalog reconciliation software system 114.

In addition to generating the C&C center instructions as described above, CAD software 104 generates data files that include descriptions of individual circuits and the harness, but CAD software 104 does not singlehandedly create harness script 112 as it is used in the present invention. Rather, automated production script generation process 140 receives data files from CAD software 104 and uses novel custom software to generate harness script 112. Harness script 112 contains circuit mechanical descriptions, circuit electrical descriptions, and wire harness manufacturing commands that are sent to assembly system 134, and are quality checked and reconciled with standard catalog 116 by automated quality control and standard catalog reconciliation process 114. In a preferred embodiment, harness script 112 is provided to assembly system 134 in machine-readable format and automatically directs the functional assembly of the wire harness at assembly system 134.

After automated quality control and standard catalog reconciliation process 114 processes harness script 112 and develops the requisite information for tooling script 132, tooling script automated generation 130 occurs so as to create tooling script 132. Tooling script 132 includes a graphical driver script for assembly system 134. In some embodiments, under the direction of tooling script 132, assembly system 134's projectors 512*a* and 512*b* (shown in FIGS. 13B and 14) project text and graphics on layout boards and modules that direct the assembly person as to which connector blocks and turn posts to install, where to place them, and how to orient them. Tooling script 132 also directs assembly system 134 to display text and graphics, with accompanying aural information, as well as LED light points for connector blocks to indicate the proper insertion points. Further, tooling script 132 includes a series of automatically generated test vectors to verify proper configuration and operation of module configuration.

Tooling script 132, in conjunction with harness script 112, a further source of component stock 128, and through the resultant circuit components manufactured 122, all come together in assembly system 134 to create wire harnesses 136. As with the prototype build system, there is a feedback loop provided from the wire harnesses 136 through harness verification process 138 back to a manner of modifying tooling script 132 to again facilitate the most efficient operation of assembly system 134.

Figure 12A:
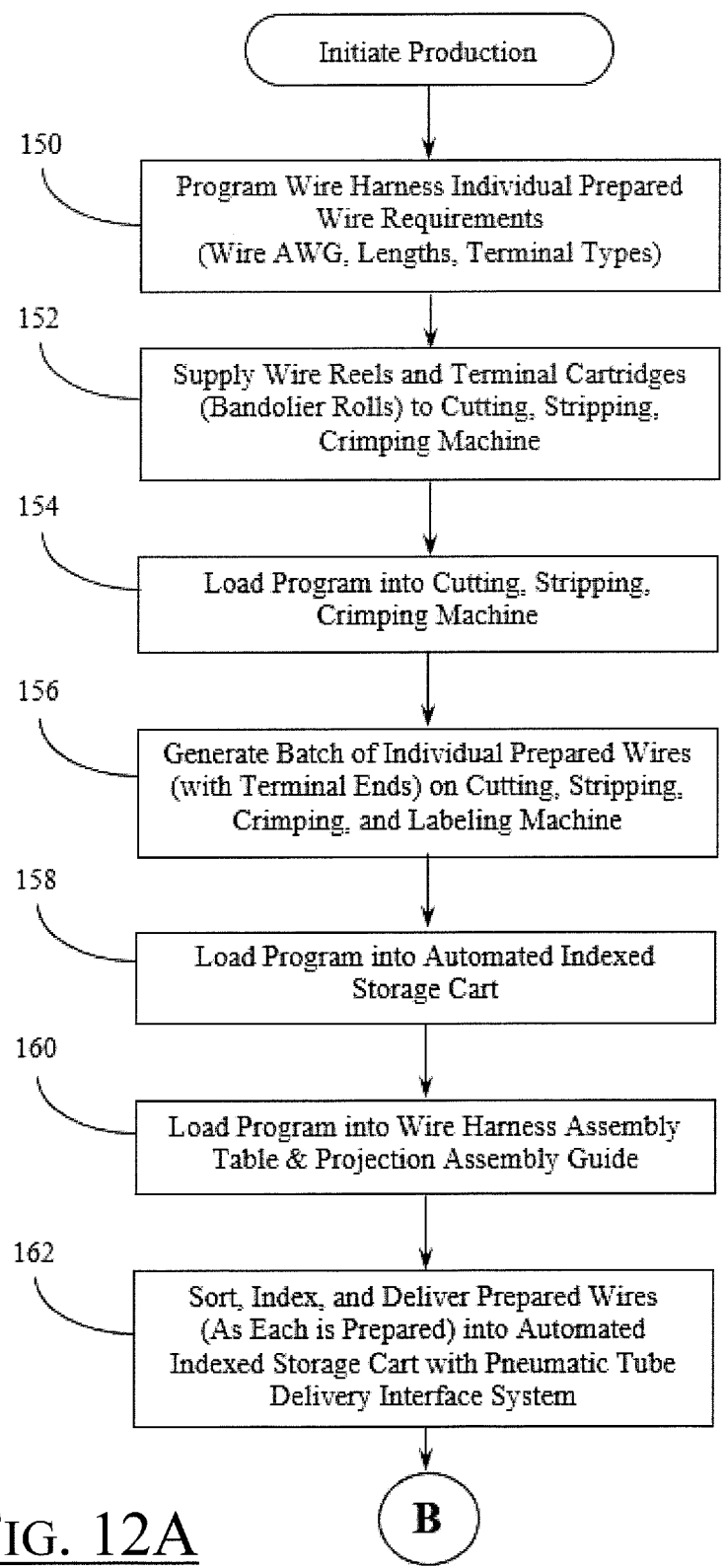
FIGS. 12A-12C are flowcharts of production process steps for circuit manufacturing, circuit indexing and storage, and guided wire harness assembly.
Figure 12B:
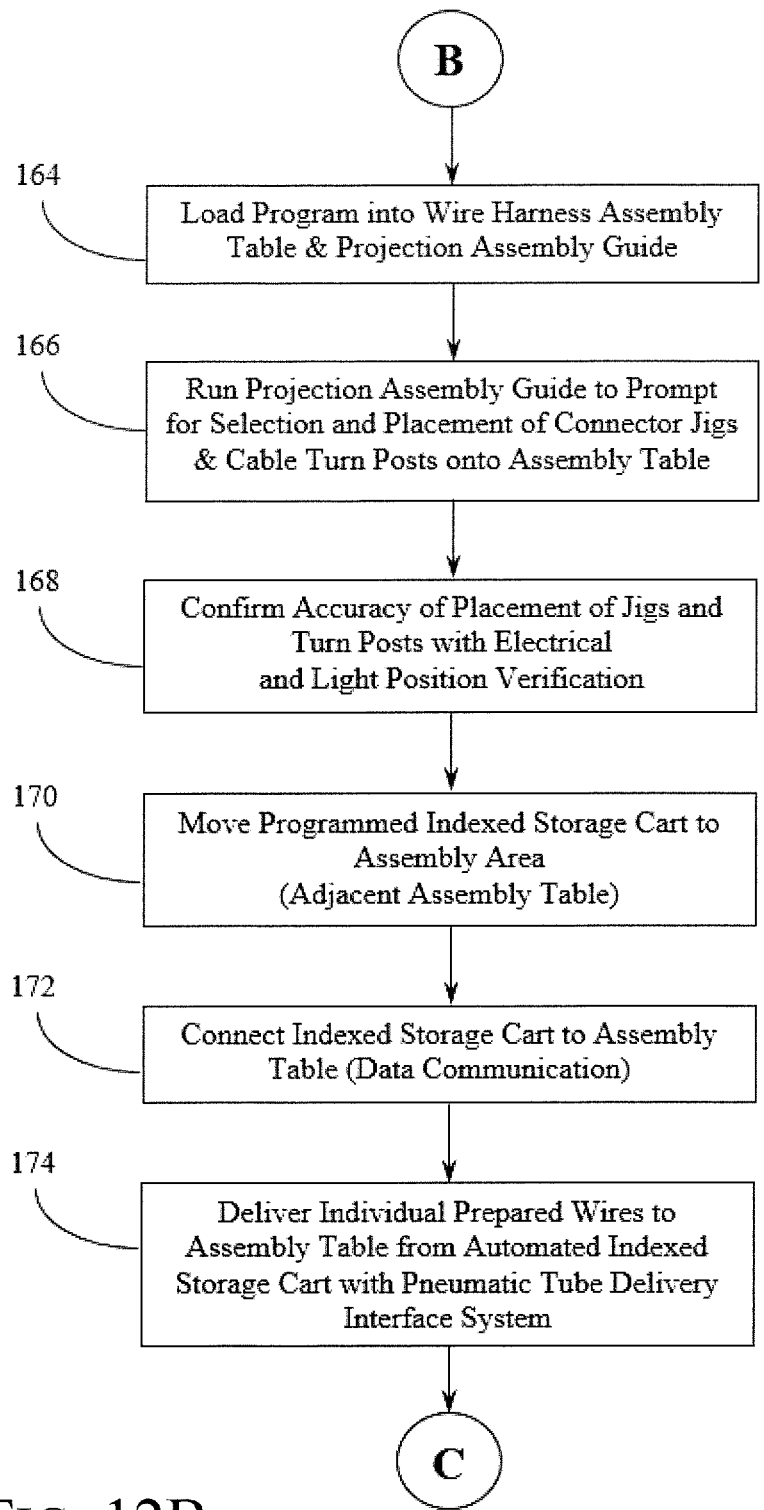
Figure 12C:
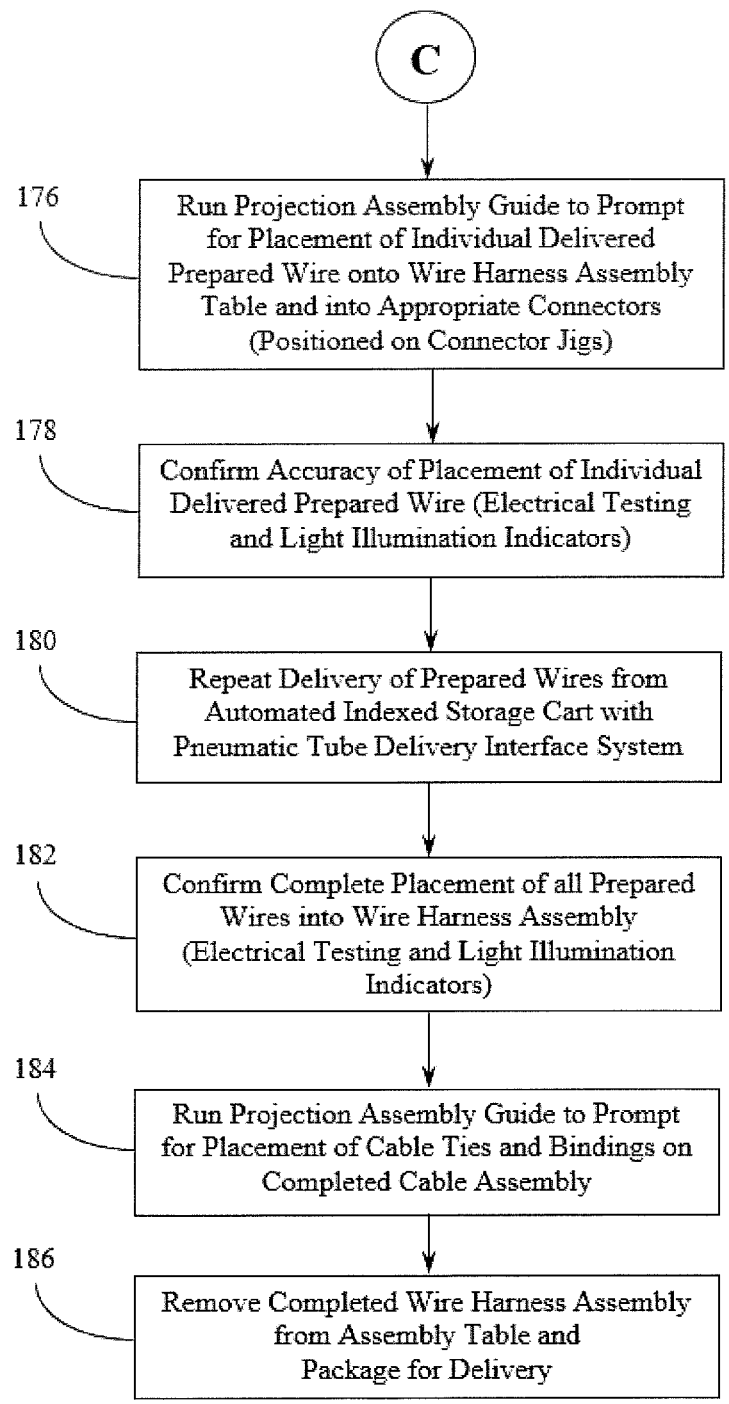

Reference is made to FIGS. 12A-12C which collectively provide a continuous flowchart of the production process steps for circuit manufacturing, circuit indexing and storage, and guided wire harness assembly. FIG. 12A provides the initiation of the production process at Step 150 where programming directed to wire harness individual prepared wire requirements (wire gauge AWG, terminal types, etc.) is carried out. The system then proceeds at Step 152 to supply wire reels and terminal cartridges (bandolier rolls) to cutting, stripping, and crimping machines. At Step 154 the system then proceeds to load programming into the cutting, stripping, and crimping machines, followed by Step 156 wherein the system generates a batch of individual prepared wires (circuits) with terminal ends. The necessary automated programming is loaded at Step 158 into the automated indexing storage cart as described above. The appropriate programming is loaded at Step 160 into wire harness assembly table and projection assembly guide as described above. Step 162 involves the sorting, indexing, and delivery of prepared circuits (as each is prepared) into the automated indexed storage cart by way of the pneumatic tube interface system.

FIG. 12B continues the process wherein Step 164 involves loading the programming into wire harness assembly table and projection assembly guide. This is followed at Step 166 where the projection assembly guides operate to prompt for the selection and placement of connector jigs and cable turn posts on the assembly table module. At Step 168 the accuracy of the placement of the jigs and turn posts with electrical and light position verification is confirmed. The process then proceeds at Step 170 to move programmed indexed storage cart to the assembly area adjacent the wire harness assembly table. The system then connects the indexed storage cart to the assembly table for data communication and movement of the circuits at Step 172. The system then, at Step 174, delivers individual prepared wires (circuits) to the assembly table from the automated indexed storage cart with the pneumatic tube delivery interface system.

In the wire harness assembly step shown in FIG. 12C, Step 176 comprises the process of running a projection assembly guide to prompt for the placement of individual delivered prepared wires (circuits) onto wire harness assembly table and into the appropriate connectors positioned on the connector jigs. This is followed at Step 178 by confirming the accuracy of the placement of the individual delivered prepared circuits by way of electrical testing and light illumination indicators. The process is repeated at Step 180 wherein additional prepared wires from the automated indexed storage cart, by way of pneumatic tube delivery system interface, are delivered to the assembly personnel for placement in association with the assembly table. At Step 182 the system confirms the complete placement of all prepared wires (circuits) onto the wire harness assembly along with the associated real time electrical testing and light illumination indicators. The system then, at Step 184, runs the projection assembly guide to prompt for the placement of cable ties and bindings on the completed wire harness assembly. Finally, the assembly personnel, at Step 186, remove the completed wire harness assembly from the assembly table and package it for delivery, having already been tested and verified in the manufacturing process.

Reference is made first to FIGS. 13A & 13B for an overview of the various sub-systems that collectively are engaged in the overall process for the production of wire harnesses according to the present invention. FIG. 13A is a partial schematic view of the circuit manufacturing sub-system (C&C centers) of the present invention involving the manufacture of the individual wire/terminal circuits that collectively go together to make up a wire harness. In general, reference herein to a circuit refers to the manufactured combination of a length or lengths of wire provide with (where applicable) terminal ends, that are collectively gathered into and make up the components within a wire harness. The terminal ends are variable in configuration and may simply involve a wire end stripped and tinned (with solder) for purposes of later attachment to a terminal block or circuit board. In most instances, however, a circuit comprises a length of wire that terminates at each end with a crimp-on metal terminal, typically of a pin or spade type. The crimp-on terminals may be either male or female. These metal terminals are most frequently designed to be collectively integrated into what will herein generally be referred to as a connector, which forms the end of a bundle of wires within a wire harness.

FIG. 13A shows the circuit manufacturing sub-system 10 as incorporating automated C&C center 12 as well as manual C&C center 26. Each of these C&C centers are in turn associated with indexed circuit storage system (cart/magazine/buffer) 36. These basic sub-systems collectively serve to manufacture the circuit elements 20 utilized in the production of the wire harness. Automated C&C center 12 may be one of a number of different commercially available automated crimping machines that include an array of wire supply reels (auto feed) 14 and an associated array of wire terminal supply cartridges (rolled bands) 16. Automated C&C center 12 will typically have at least one means for programming the device. The device may be programmed by operator commands entered into C&C center programming terminal 18. In another embodiment, automated C&C center 12 may be programmed from a remote data input terminal device. In yet another embodiment, automated C&C center 12 may be programmed by importing files from CAD software 104.

Automated C&C center 12 produces a completed wire/terminal circuit 20 of a length, gauge, and terminal type, as specified by the programming provided to automated C&C center 12. Such programming is versatile and can direct automated C&C center 12 to produce a large number of a single type of circuit 20 or a long list of entirely distinct circuits that together might be eventually bundled to form a wire harness. In the present invention, a very efficient operation of automated C&C center 12 would be to produce a long list of individual circuits required to construct one particular type of wire harness. The C&C center may produce a number of circuit sets that are indexed and stored (as described in more detail below) and then later utilized to produce a number of the same type of wire harness.

Functioning in parallel with automated C&C center 12 is manual C&C center 26. A manual C&C center 26 may be required where one or more custom circuits 32 might be anticipated in the manufacture and construction of a given wire harness. This may result from specialized terminal ends or from a non-typical wire gauge or type. In such instances, an individual circuit 32 may be manufactured at manual C&C center 26 which, like automated C&C center 12, includes an array of wire supply reels 28 and an array of wire terminals supply containers (typically bulk containers) 30. Manual mechanisms for feeding wire and hand selecting terminals to be crimped onto the wire are as known in the art for such manual C&C center configurations.

Automated C&C center 12 and manual C&C center 26 each provide a completed wire/terminal circuit 20 or 32 which is delivered into an indexed circuit storage system (cart/magazine/buffer) 36 by way of an associated pneumatic conduit 22 or 34 and a circuit indexing sub-system 24. Indexed circuit storage system 36 includes a mobile cart configured with a large array 38 of linear tubes 39, each of which may hold one or more completed wire/terminal circuits. This array 38 of storage tubes 39 operates in conjunction with circuit indexing sub-system 24 such that every tube 39 within the array 38 of the cart/magazine/buffer 36 is identified and indexed to contain a known type of circuit element 20 or 32. In this manner, indexed circuit storage system 36 may be programmed and loaded with a full circuit element set appropriate for the manufacture of a particular type of wire harness. Wire harnesses may of course come in a variety of configurations having less than ten circuit elements to hundreds of circuit elements. Indexed circuit storage system 36 is designed to accommodate simple or complex wire harness circuit sets.

The combination of circuit indexing sub-system 24 and pneumatic conduits 22 and 34 serve to deliver completed wire/terminal circuits 20 and 32 from the respective C&C centers into a properly indexed storage tube within indexed circuit storage system 36. As described in more detail below, circuit indexing sub-system 24 is in one embodiment a mechanism for moving one end of pneumatic conduit 22 and/or 34 to a position adjacent the storage cart input port array 38 on indexed circuit storage system 36. As mentioned above, the entire indexing system may be programmed and may in the preferred embodiment be controlled by way of computer system 40. In this manner, each completed wire/terminal circuit from the respective C&C center may be directed into a known and indexed storage tube 39 where it may be held until such time as the manufacturing of that particular wire harness assembly is carried out. The basic structure of the circuit indexing sub-system 24 is an X-Y coordinate variable position frame and track system that allows for the directed movement of the end of the pneumatic delivery tube into contact with the appropriate indexed storage tube.

In one embodiment of the present invention, each of the storage tubes 39 associated with indexed circuit storage system 36 may be designed to retain a single circuit element 20 for later delivering during the assembly of the wire harness. Alternate embodiments of the present invention anticipate the utilization of storage tubes 39 capable of retaining a number of like circuit elements for later use and delivering such circuit elements one at a time in a repetitive manner. Therefore, the index circuit storage system (cart/magazine/buffer) 36 may be configured to receive, store and deliver a full circuit element set appropriate for the manufacture of a single wire harness or, in an alternate embodiment, the same cart may be configured to receive, store, and deliver ten or more sets of circuit elements by repeatedly drawing out a full set for the manufacture of a wire harness followed by second and subsequent full sets all from the same storage vehicle.

Reference is now made to FIG. 13B. The features with the same numbers in FIGS. 8B and 13B are identical. Therefore, the textual descriptions that are the same for FIG. 13B as for FIG. 8B are not repeated here. In the view shown in FIG. 13B, indexed circuit storage cart 36 is moved to a position adjacent the wire harness assembly sub-system 50. Indexed circuit storage system 36 may include, or may be controlled by, a computer system 40 that facilitates the automation of the process of indexing, storing, and delivering the circuit elements. Although computer system 40 is shown on top of storage system 36, in a preferred embodiment computer system 40 is a computer server system that stores information about storage system 36's contents but is not physically attached to storage system 36. Also shown in FIG. 13B is storage cart output port array 42 similar in structure to the storage cart input port array 38 shown in FIG. 13A. In one embodiment of the present invention, storage cart output port array 42 may comprise the same array of ports as storage cart input port array 38 and cart 36 is simply turned around for receipt or delivery of the circuit elements. Alternately, these storage cart port arrays may comprise opposite ends of the mobile indexed circuit storage systems (cart/magazine) 36.

As with the input of circuit elements into indexed storage circuit system 36, the output or delivery of the circuits is carried out, in one embodiment, by way of circuit indexing sub-system 44 which effectively reverses the indexing process and selectively withdraws the appropriate circuit element from the storage cart to be delivered to the wire harness assembly sub-system 50. This delivery is again carried out by way of pneumatic conduit 46 which withdraws a circuit element from storage system 36 and delivers it to wire harness assembly sub-system 50 for use in conjunction with the assembly process.

While assembly personnel manually receive circuit elements from the circuit indexing sub-system 44 by way of the pneumatic conduit 46 as described above, or from circuit indexing sub-system 85 and conveyor belts 202 and 204 as described above, the process of placing the circuit element onto the assembly table and making the appropriate connections is automatically guided and confirmed by the systems and methods of the present invention.

Figure 13C:
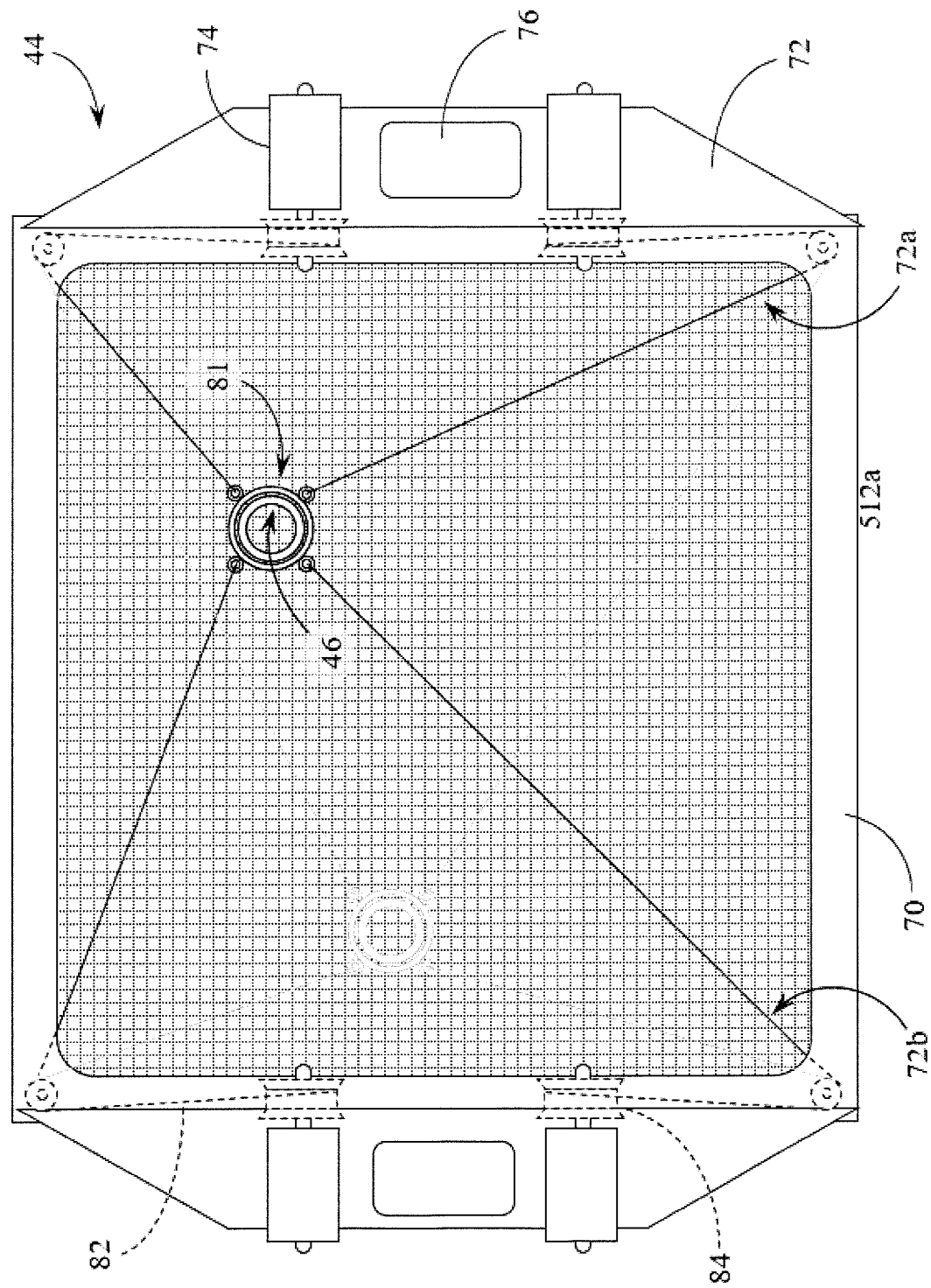
FIG. 13C is a detailed side plan view of one of the circuit indexing sub-systems of the alternative embodiment shown in FIGS. 12A and 13B.

Reference is now made to FIG. 13C for a more detailed description of two of the more critical components within the system and method of the present invention. FIG. 13C is a detailed side plan view of one embodiment of a circuit indexing sub-system 44 utilized to deliver completed circuit elements into and out from the mobile storage system (cart/magazine/buffer) 36 of the present invention. It is understood that, as discussed above, such an indexing sub-system would preferably be positioned in conjunction with both the circuit manufacture sub-system 12, 26 (the C&C centers) and the harness assembly sub-system 50 (the assembly table) and would provide the manner of directing completed circuit elements into the mobile indexing storage cart as well as providing delivery of the same from the mobile cart to the harness assembly table. Those skilled in the art will recognize that the system may preferably include two circuit indexing sub-systems, one for delivery of the manufactured circuit elements into the storage cart and one for delivery of the indexed circuit elements from the storage cart to the assembly table. Alternately, the storage cart might retain a single array of ports that serve as both the input and output ports for reception and delivery of the various circuit elements stored within the mobile cart. In other words, the circuit indexing sub-system 44 shown in FIG. 13C could also serve as the circuit indexing sub-system 24 described above for receiving manufactured circuit elements into the cart. It would be a simple matter of connecting and disconnecting the pneumatic hoses associated with each of the stations discussed above and appropriately programming the X-Y indexing and sorting system to either direct (pneumatically) a just completed circuit element into the storage cart or to withdraw a previously indexed circuit element from the cart.

In one embodiment, circuit indexing sub-system 44 is connected to pneumatic conduit 46 by way of conduit indexing shuttle ring bracket 81. Circuit indexing sub-system 44 is generally comprised of indexing system X-Y frame 70 as well as X-Y frame controller bracket 72. Positioned on controller bracket 72 are X-Y position DC stepping motors 74. Each set of DC stepping motors 74 is connected to and controlled by at least one X-Y frame microcontroller 76. DC stepping motors 74 are connected to conduit indexing shuttle ring bracket 81 by way of X-Y positioning tension cables $72a$-$78d$. These cables extend from cable drive/take-up reels 84, each positioned on one of X-Y position DC stepping motors 74 and each terminating on conduit indexing shuttle ring bracket 81 after passing over cable corner pulleys 82. In an alternative embodiment, shuttle ring bracket 81 may be positioned using electric screw drives rather than an arrangement of pulleys as described herein.

The microcontrollers 76 of the present invention therefore direct the appropriate signals to DC stepping motors 74 which turn cable drive/take-up reels 84 and by tension provided in X-Y position tension cables $72a$-$78d$ position and hold bracket 81 and its associated pneumatic conduit end 46 over any X-Y position within the X-Y frame 70. It is understood that the array of input ports to the storage cabinet are positioned behind or adjacent to the circuit indexing sub-system 44 and are thereby accessible at any particular position that conduit indexing shuttle ring bracket 81 is placed. Depending therefore upon which storage tube within the storage cabinet a particular completed circuit element is intended to be stored, the DC stepping motors 74 direct the movement of conduit indexing shuttle ring bracket 81 (and therefore of the pneumatic conduit 46) to a particular location on an X-Y plane defined by the ends of the various input ports associated with the storage cabinet (not shown). Maintaining tension on each of the X-Y position tension cables $72a$-$78d$ allows for any location within the X-Y frame 70 to be moved to and maintained.

Once an X-Y position has been established, the system may activate the pneumatic components associated with the pneumatic conduit and direct the circuit element contained within the pneumatic conduit out from the conduit through the conduit indexing shuttle ring bracket 81 and into the appropriate input port on the portable storage cart. Those skilled in the art will recognize various mechanisms for directing air flow through the pneumatic components of the system as described above. These pneumatic components are configured to direct a flow of air through the appropriate tubing components, both for receiving circuit elements into inlet tubing components (such as by directing a negative pressure on such components) and/or to direct a flow of air out from a delivery tube component (such as by providing a positive pressure on such a delivery component). It is anticipated that the air flow movement may be directed from components within the storage cart itself creating the negative pressure necessary to draw a properly positioned circuit element into the storage cart by way of the indexed pneumatic tubing, and likewise to deliver a positive pressure flow of air from the storage cart (by way of the appropriate indexed storage tube) to the delivery pneumatic tube that has been properly positioned to carry the circuit element from the cart to the wire harness assembly table. Various other pneumatic controls, seals, valves, and control elements appropriate for implementing these two basic functions within the pneumatic system should be apparent to those skilled in the art.

Reference is now made to FIG. 14 for a description of an improvement and alternate embodiment of the second half of the wire harness production process. The sub-systems described in FIGS. 8A & 8B and other figures are generally the same and perform the same functions in the improvement described in FIG. 14. However, the invention in FIG. 14 includes certain features that greatly improve upon the earlier invention. The invention in FIG. 14 includes two conveyor belts 202 arranged so that one is parallel above the other. The distance between the two conveyor belts 202 is adjusted to the optimum distance so that each conveyor belt 202 comes in contact with the appropriate circuit element from the storage cart to be delivered to the wire harness assembly sub-system 50. The advantage of the two conveyor belts 202 arranged in this manner is efficient and consistent delivery of the circuit element 20 from the storage cart 36 to the wire harness assembly sub-system 50.

The next improvement of the invention depicted in FIG. 14 is the addition of the double buffer assembly 300. The double buffer assembly 300 comprises the circuit element sensor 301, the cover assembly 302, the circuit element buffer tray 303, circuit element buffer 304, and the air knife 305. The circuit element sensor 301 senses the presence or absence of a circuit element in the circuit element buffer tray 303. The circuit element sensor 301 may be any sensor whether optical or otherwise that can detect the presence of absence of a circuit element in the circuit element buffer tray 303. The circuit element sensor 301 transmits the presence or absence of a circuit element in the circuit element buffer tray 303 to a computer system 40. Upon sensing the absence of a circuit element in the circuit element buffer tray 303 the computer system 40 automatically directs the air knife 305 to deposit the buffered circuit element into the circuit element buffer tray 303 and for the delivery of the next circuit element to the circuit element buffer 304. The air knife 305 may be any device appropriate to quickly move the circuit element from the circuit element buffer 304 to the circuit element buffer tray 303. In the present embodiment this consists of an air knife as is known in the art. The circuit element buffer 304 is protected by the cover assembly 302, which prevents the assembly personnel from taking the wrong circuit assembly.

The double buffer assembly 300 allows the assembly personnel to nearly always have the next circuit element waiting for assembly in the circuit element buffer tray 303. The double buffer assembly 300 greatly speeds up the assembly process as the assembly personnel no longer have to wait for the delivery of the next circuit element from the indexed circuit storage cart 36, but rather only has to wait for the nearly instantaneous delivery of the next circuit element into the circuit element buffer tray 303.

The figures and descriptions in this application depict specific examples to teach those skilled in the art how to make and use the best mode of the invention. These examples are not given to limit the scope of the invention, but rather to teach inventive principles. To concisely teach inventive principles, some conventional aspects of the invention have been simplified or omitted. Those skilled in the art will appreciate many of the configurations, combinations, subcombinations, and variations on these examples that fall within the scope of the invention. For example, certain features of the invention described in separate embodiments can also be implemented in combination in a single embodiment. Conversely, various features that are described in the context of a single embodiment can also be implemented in multiple embodiments—separately or in any suitable subcombination. The invention is not limited to the specific illustrative examples described herein, but by all embodiments and methods within the scope and spirit of the invention as in the current, amended, or added claims and their equivalents. In any case, all substantially equivalent systems, articles, and methods should be considered within the scope of the invention.

We claim:

1. A computer-aided wire harness assembly system using augmented reality, comprising:
   a) a wire harness assembly table comprising at least two assembly table modules, each of the at least two assembly table modules being configured to receive one or more circuit elements and other wire harness assembly components;
   b) an augmented reality (AR) device being configured and adapted to present an augmented reality (AR) display, the AR display being adapted to superimpose, on an actual view of the assembly table and the at least two assembly table modules, a virtual representation of a proper placement location for the one or more circuit elements and other wire harness assembly components, wherein the superimposition of the virtual representation of the proper placement location for the one or more circuit elements and other wire harness assembly components on the AR display indicates to a wire harness assembler appropriate connections of the one or more circuit elements with one or more of the other wire harness assembly components; and
   c) a plurality of jigs, wherein each jig in the plurality of jigs is an interface between one of the wire harness assembly components and one of the at least two assembly table modules, and wherein each jig in the plurality of jig comprises:
      1) an enclosure;
      2) a single board computer that interfaces with one of the at least two assembly table modules;
      3) a cable configured to connect the single board computer to one of the at least two assembly table modules; and
      4) a pushbutton switch mounted on the enclosure, the pushbutton switch being adapted and configured to allow the wire harness assembler to respond to prompts.

2. The computer-aided wire harness assembly system of claim 1, wherein the AR device is adapted to present a superimposed virtual representation of text-based instructions for proper placement of the wire harness assembly components on at least one assembly table module of the at least two assembly table modules.

3. The computer-aided wire harness assembly system of claim 2, wherein the virtual representation of text-based instruction is superimposed on the actual view of the at least one assembly table module in proximity to a location that represents correct placement of a particular circuit element or other wire harness assembly component.

4. The computer-aided wire harness assembly system of claim 1, wherein the AR device comprises augmented reality glasses.

5. The computer-aided wire harness assembly system of claim 1, wherein each of the at least two assembly table modules are programmable, wherein at least one programmable aspect included each of the at least two assembly table modules being adapted to verify each connection made thereon, and the at least two assembly table modules being further adapted to electrically test each circuit element placed thereon.

6. The computer-aided wire harness assembly system of claim 5, wherein after verification and testing, the AR device is adapted to superimpose a virtual color-coded indicator on the view of the programmable modules, wherein the color-coded indicator signifies either a successful or an unsuccessful circuit element placement or connection.

7. The computer-aided wire harness assembly system of claim 6, wherein the color-coded indicator is virtually displayed in proximity to the successful or unsuccessful circuit element placement or connection.

8. A computer-aided wire harness assembly system using augmented reality, comprising:
   a) a presentation system, comprising:
      1) a circuit element buffer surface having a length that is long enough to receive a predetermined length of a circuit element, wherein the circuit element buffer surface is positioned to receive the circuit element and to temporarily support the circuit element;
      2) a circuit element tray having a length long enough to receive the predetermined length of the circuit element, the circuit element tray defining a space that is accessible to an assembler;
      3) a circuit element sensor for detecting the presence or absence of the circuit element in the accessible space of the circuit element tray; and
      4) an air knife for laterally moving the received circuit element from the circuit element buffer surface to the accessible space of the circuit element tray;
   b) an assembly table comprising two assembly table modules, the assembly table modules being configured to receive one or more circuit elements and other wire harness assembly components;
   c) a wearable augmented reality (AR) device being configured and adapted to present an augmented reality (AR) display, the AR display being adapted to superimposed, on an actual view of the assembly table and the two assembly table modules, a virtual representation of a proper placement location for the one or more circuit elements and other wire harness assembly components onto one of the two assembly table modules, wherein the superimposition of the virtual representation of the proper placement location of the one or more wire harness assembly components on the AR display indicates to the assembler appropriate connections of the one or more circuit elements with one or more of the other wire harness assembly components; and
   d) a plurality of jigs, wherein each jig in the plurality of jigs is an interface between one of the wire harness assembly components and one of the at least two assembly table modules, and wherein each jig in the plurality of jig comprises:
      1) an enclosure;
      2) a single board computer that interfaces with one of the at least two assembly table modules;
      3) a cable configured to connect the single board computer to one of the at least two assembly table modules; and
      4) a pushbutton switch mounted on the enclosure, the pushbutton switch being adapted and configured to allow the wire harness assembler to respond to prompts.

9. The computer-aided wire harness assembly system of claim 8, wherein the virtual representation of the proper placement location for the one or more circuit elements and other wire harness assembly components includes text-based instructions.

10. The computer-aided wire harness assembly system of claim 9, wherein the virtual representation of text-based instructions is superimposed on the actual view of at least one of the two assembly table modules in proximity to a location that represents correct placement of a particular circuit element or other wire harness assembly component.

11. The computer-aided wire harness assembly system of claim 8, wherein the AR device comprises augmented reality glasses.

12. The computer-aided wire harness assembly system of claim 8, wherein each of the two assembly table modules are programmable, wherein at least one programmable aspect includes each of the two assembly table modules being adapted to verify each connection made thereon, and the two assembly table modules being further adapted to electrically test each circuit element placed thereon.

13. The computer-aided wire harness assembly system of claim 12, wherein after verification and testing, the AR device is adapted to superimpose a virtual color-coded indicator on the view of the two assembly table modules, wherein the color-coded indicator signifies either a successful or an unsuccessful circuit element placement or connection.

14. The computer-aided wire harness assembly system of claim 13, wherein the color-coded indicator is virtually displayed in proximity to the successful or unsuccessful circuit element placement or connection.

\* \* \* \* \*